US011415636B2

(12) United States Patent
Van Vroonhoven

(10) Patent No.: US 11,415,636 B2
(45) Date of Patent: Aug. 16, 2022

(54) DIFFERENTIAL ELECTRICAL IMPEDANCE SPECTROSCOPY

(71) Applicant: Analog Devices International Unlimited Company, Limerick (IE)

(72) Inventor: Caspar Petrus Laurentius Van Vroonhoven, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 193 days.

(21) Appl. No.: 16/872,877

(22) Filed: May 12, 2020

(65) Prior Publication Data

US 2021/0356525 A1 Nov. 18, 2021

(51) Int. Cl.
   *G01R 31/389* (2019.01)
   *G01R 31/392* (2019.01)
   (Continued)

(52) U.S. Cl.
   CPC ....... *G01R 31/389* (2019.01); *G01R 31/3842* (2019.01); *G01R 31/392* (2019.01);
   (Continued)

(58) Field of Classification Search
   CPC .............. G01R 31/389; G01R 31/3842; G01R 31/392; G01R 31/396; G01R 27/02;
   (Continued)

(56) References Cited

U.S. PATENT DOCUMENTS

| 5,281,920 A | 1/1994 | Wurst |
| 6,816,797 B2 | 11/2004 | Freeman et al. |

(Continued)

FOREIGN PATENT DOCUMENTS

| CA | 3031564 C | 5/2019 | | |
| CN | 106289566 A | * | 1/2017 | .............. B60L 50/64 |

(Continued)

OTHER PUBLICATIONS

Analog-to-digital converter, available Dec. 31, 2019 at https://en.wikipedia.org/wiki/Analog-to-digital_converter (Year: 2019).*

(Continued)

*Primary Examiner* — Daniel R Miller
(74) *Attorney, Agent, or Firm* — Schwegman Lundberg & Woessner, P.A.

(57) ABSTRACT

A device having a structure to measure a battery parameter of a battery of a set of multiple batteries can be implemented in a variety of applications. The device can be structured to measure alternating current (AC) electrical impedance of a battery cell by processing a difference between the battery cell and another battery cell. The battery cell being measured is subjected to AC excitation while the other one is not, where the two battery cells share a common load current. This differencing method can reduce the measurement's sensitivity to noisy battery load current, which is common to both battery cells. This differencing method also can remove or substantially reduce a large direct current (DC) offset, that is, the battery potential itself under which the AC signal measurement is burdened.

17 Claims, 7 Drawing Sheets

(51) Int. Cl.
*G01R 31/396* (2019.01)
*H01M 10/42* (2006.01)
*H01M 10/48* (2006.01)
*G01R 31/3842* (2019.01)

(52) U.S. Cl.
CPC ...... *G01R 31/396* (2019.01); *H01M 10/4257* (2013.01); *H01M 10/4264* (2013.01); *H01M 10/482* (2013.01); *H01M 2010/4271* (2013.01)

(58) Field of Classification Search
CPC ......... H01M 10/4257; H01M 10/4264; H01M 10/482; H01M 2010/4271; Y02E 60/10
See application file for complete search history.

(56) References Cited

U.S. PATENT DOCUMENTS

| | | |
|---|---|---|
| 9,177,466 B2 | 11/2015 | Xie et al. |
| 9,325,193 B2 | 4/2016 | Kelly |
| 9,509,004 B2 | 11/2016 | Jomori et al. |
| 9,519,031 B2 | 12/2016 | Jamison |
| 9,575,135 B2 | 2/2017 | van Lammeren et al. |
| 9,753,092 B2 | 9/2017 | Fujii |
| 10,139,453 B2 | 11/2018 | Mizoguchi |
| 2006/0170397 A1* | 8/2006 | Srinivasan ......... G01R 31/3842 320/132 |
| 2012/0306504 A1 | 12/2012 | Van Lammeren |
| 2013/0293187 A1 | 11/2013 | Milios |
| 2015/0168500 A1 | 6/2015 | Jamison |
| 2015/0185291 A1* | 7/2015 | Dao .................. H04Q 9/00 324/434 |
| 2018/0059191 A1* | 3/2018 | Abu Qahouq ....... G01R 31/392 |
| 2018/0337536 A1 | 11/2018 | Li et al. |
| 2019/0288520 A1 | 9/2019 | Abdel-monem et al. |
| 2020/0036058 A1 | 1/2020 | Van Lammeren |

FOREIGN PATENT DOCUMENTS

| | | | |
|---|---|---|---|
| CN | 109633454 A | * | 4/2019 |
| CN | 109828218 A | * | 5/2019 |
| DE | 102013013471 A1 | | 2/2015 |
| DE | 102013218081 | | 3/2015 |
| EP | 3317683 A1 | | 5/2018 |
| TW | 201509061 A | | 3/2015 |
| WO | WO-2014128395 A1 | | 8/2014 |
| WO | WO-2016012922 A1 | * | 1/2016 .............. B60L 50/64 |

OTHER PUBLICATIONS

"International Application Serial No. PCT/EP2021/062726, International Search Report dated Aug. 20, 2021", 4 pgs.

"International Application Serial No. PCT/EP2021/062726, Written Opinion dated Aug. 20, 2021", 5 pgs.

Din, Eric, "A Scalable Active Battery management System with Embedded Real-Time Electrochemical Impedance", IEEE preprint, (2016), 11 pgs.

Varnosfaderani, Mina Abedi, et al., "Online impedance spectroscopy estimation of a dc-dc converter connected battery using a switched capacitor-based balancing circuit", The Journal of Engineering, vol. 2019, Issue 7, (2019), 4681-4685.

* cited by examiner

DIFFERENTIAL ELECTRICAL IMPEDANCE SPECTROSCOPY

FIELD OF THE DISCLOSURE

This document relates to electrical circuits and, in particular, to circuits to measure a battery parameter.

BACKGROUND

Automotive battery management systems (BMSs) are used to keep track of a state of charge (SOC) and a state of health (SOH) of battery cell stacks such as, but not limited to, large battery cell stacks used in electric vehicles. BMSs are also used to balance the battery cells of the battery stacks to maximize their lifetime and total energy stored. BMS integrated circuits (ICs) generally operate by measuring each of the cell voltages in a stack and partially bypassing the current flowing through each cell if so required. BMS ICs typically also measure the temperature of the cells using several temperature sensors that are mounted to the outside of the cells. The data from the measurements is used in an algorithm to calculate SOC and SOH (among others), and to evaluate whether or not the cells are at a safe operating temperature.

There are a number of issues that relate to the inaccuracy of some of the measured values. The accuracy of determining SOC by measuring the cell voltage depends on the cell voltage being well-defined and sufficiently dependent on SOC. This is not guaranteed for all cell chemistries, and it requires very accurate voltage measurements, that, in turn, require precision voltage references and precision measurement circuitry. Second, measuring temperature via external sensors may underestimate the internal cell temperature. This affects lifetime estimates. Also, these quantities, which relate to the internal and external temperature, can be significantly different during high-current regimes, for example during accelerating and braking. Better measurement of these quantities would enhance how much use an application of a battery, such as by a car for example, can get from the battery. Higher accuracy for SOC, SOH, and temperature will improve the range, lifetime, and performance of the car.

SUMMARY OF THE DISCLOSURE

A device having a structure to measure a battery parameter of a battery of a set of multiple batteries can be implemented in a variety of applications. The device can be structured to measure alternating current (AC) electrical impedance of a battery cell by processing a difference between the battery cell and another battery cell. The battery cell being measured is subjected to AC excitation while the other one is not, where the two battery cells share a common load current. This differencing method can reduce the measurement's sensitivity to noisy battery load current, which is common to both battery cells. This differencing method also can remove or substantially reduce a large direct current (DC) offset, that is, the battery potential itself under which the AC signal measurement is burdened.

For example, in certain embodiments, a device, having a structure to measure a battery parameter, can be provided that discloses: a signal driver attachable to two battery cells, the signal driver arranged to selectively excite a first battery cell of the two battery cells with a time varying signal while maintaining a second battery cell of the two battery cells in a non-excitation status during the exciting of the first battery cell, with the first battery cell and the second battery cell having a common load current in operation; a circuit to measure voltage difference between voltage across the first battery cell and voltage across the second battery cell, with the first battery cell excited and with the second battery cell of the two battery cells in the non-excitation status; and a signal processing circuit to process the measured voltage difference to determine an electrical impedance of the first battery cell.

In certain embodiments, a method of determining a battery parameter can be provided that discloses: exciting a first battery with a time varying signal; maintaining a second battery in a non-excitation status during the exciting of the first battery, with the first battery and the second battery having a common load current in operation; measuring a voltage difference between voltage across the first battery and voltage across the second battery for the first battery excited and the second battery in the non-excitation status; and processing the measured voltage difference to determine an electrical impedance of the first battery.

In certain embodiments, a device, having a structure to measure a battery parameter, can be provided that discloses: a means for exciting selectively a first battery of a pair of batteries with a time varying signal and for maintaining a second battery of the pair in a non-excitation status during the exciting of the first battery, with the first battery and the second battery having a common load current in operation; a means for measuring a voltage difference between voltage across the first battery and voltage across the second battery; and a means for processing the measured voltage difference to determine an electrical impedance of the first battery.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

Figure 1A:
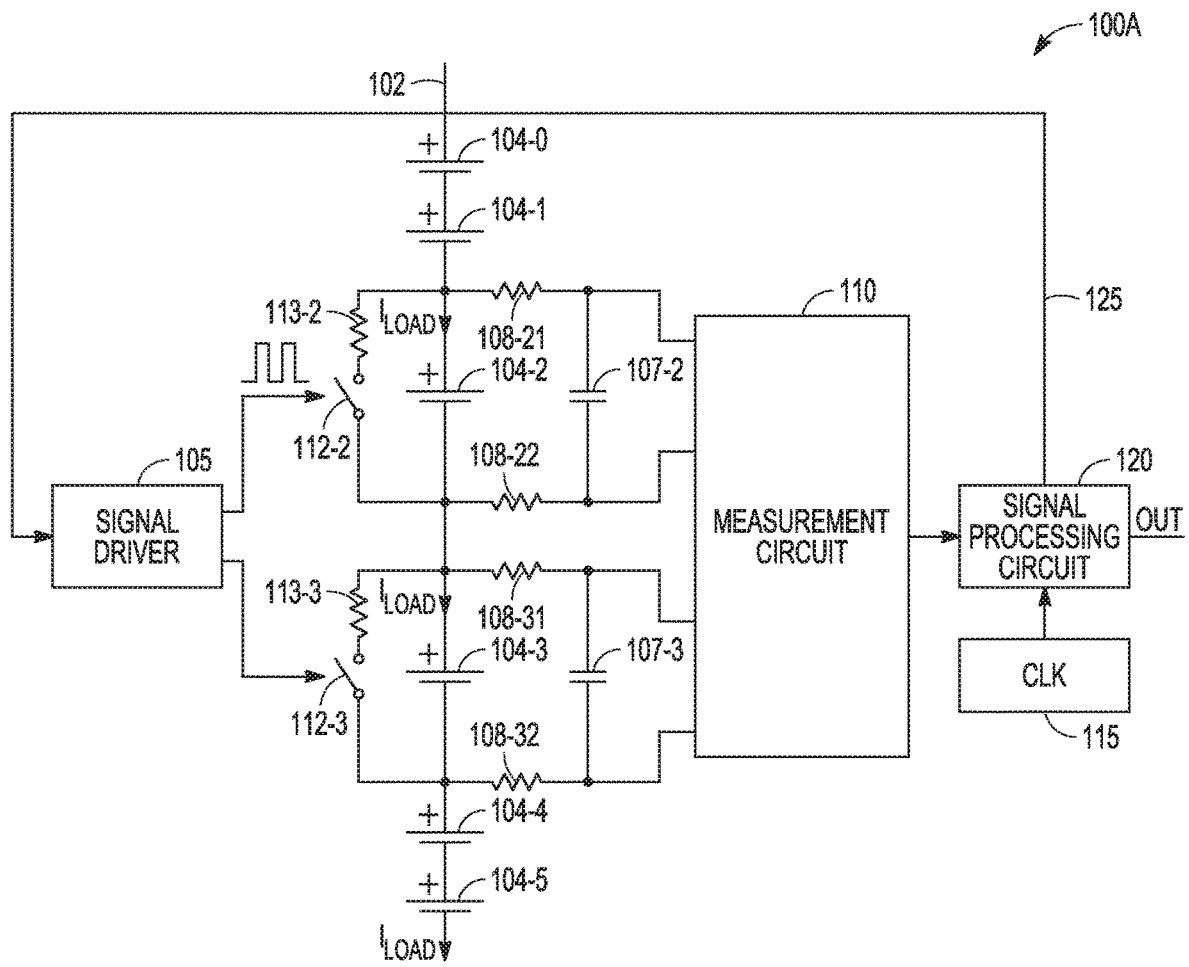
FIG. 1A illustrates an example dual-cell measurement circuit, which can be arranged in a device as a structure to measure battery parameters of two batteries, according to various embodiments.

One way to measure one or more battery parameters of a set of battery cells is not via voltage, but via frequency-dependent electrical impedance of each of the battery cells. The complex impedance of a battery cell, over for example 0.1 Hz to 10 kHz range, is a function of SOC, SOH internal temperature in different ways, so each of these parameters can be determined with the measurement of impedance over frequency. In various embodiments, electrical impedance spectroscopy (EIS) can be performed to measure a battery parameter using a dual-cell approach. Of two battery cells, only one battery cell is excited at a time, with a difference between the battery cell voltages of the two battery cells being processed. The two battery cells can be neighboring battery cells in a set of battery cells that share a common load current or two non-neighboring battery cells in the set that share a common load current. This difference measurement can achieve load current and battery cell voltage offset compensation, making signal processing much more straightforward. Such methods work especially well because these methods are commensurate with algorithms having a goal to balance all cells against each other. These methods can be further enhanced by applying the dual-cell approach to two neighboring cells that can match well over a lifetime, making the cancellation of common factors work well.

The use of differential EIS in the dual-cell approach can be implemented without using a high pass filter (HPF) and without measuring individual-cell voltage, while providing substantially instantaneous load current compensation. This is in contrast to single-cell EIS in which a discharge switch, normally used during balancing, is driven with an AC signal, which causes a current to run through the cell, generating a voltage response. In the single-cell EIS approach, the voltage is then post-processed, and the amplitude and phase shift are computed, compared to the excitation current. Drawbacks of the single-cell EIS approach include the load current corrupting the output voltage and the load current being measured separately for compensation purposes. This is particularly applicable for the case for lower/mid-range frequencies. In the single-cell EIS approach, each battery cell uses a dedicated IC to perform EIS, which is expensive, and the small AC signal needs to be separated from the large DC offset that comes from the battery voltage itself.

In various embodiments, EIS performed to measure a battery parameter using a dual-cell approach, as taught herein, can provide a less expensive, straight forward measurement approach than the single-cell EIS approach. In other embodiments, EIS can be performed to measure a battery parameter using a multi-cell approach similar the dual-cell approach, taught herein. As in the dual-cell approach, a multi-cell approach can include exciting one battery cell of a set of multiple battery cells, while maintaining the other battery cells of the set in a non-excited state, and taking differential measurements.

FIG. 1A illustrates an embodiment of an example dual-cell measurement circuit 100A, which can be arranged in a device as a structure to measure battery parameters of two batteries 104-2 and 104-3. Dual-cell measurement circuit 100A is coupled to batteries 104-2 and 104-3 of a set 102 of multiple batteries 104-0, 104-1, 104-2, 104-3, 104-4, and 104-5 to determine a battery parameter of the two batteries using a dual-cell approach. Dual-cell measurement circuit 100A can be coupled to battery 104-2 using four wires and to battery 104-3 using four wires, where the coupling can be within a housing for these batteries. With dual-cell measurement circuit 100A, battery 104-2 can be subjected to an AC excitation while battery 104-3 is not excited to measure a battery parameter of battery 104-2, where the two battery cells share a common load current. Operation of dual-cell measurement circuit 100A can include selecting battery 104-3 to be subjected to AC excitation while battery 104-2 is not excited, to measure a battery parameter of battery 104-3. The ordering of the measurement of the battery parameter of batteries 104-2 and 104-3 can be randomly selected or based on procedures of an architecture or system in which batteries 104-2 and 104-3 are deployed.

The set 102 of multiple batteries 104-0, 104-1, 104-2, 104-3, 104-4, and 104-5 can be realized as a stack of battery cells sharing a common load current $I_{LOAD}$ in operation. The batteries 104-0, 104-1, 104-2, 104-3, 104-4, and 104-5 can be arranged to operate with common $I_{LOAD}$ with the batteries 104-0, 104-1, 104-2, 104-3, 104-4, and 104-5 coupled in electrical series. Though FIG. 1A shows six batteries, the set 102 can be implemented as a set of battery cells having more or less than six batteries. Batteries 104-2 and 104-3 can be arranged as directly adjacent cells in the set 102 arranged as a stack of battery cells with the batteries 104-0, 104-1, 104-2, 104-3, 104-4, and 104-5 arranged in series such that, in operation, $I_{LOAD}$ is common to each battery of the stack. Alternatively, batteries 104-2 and 104-3 can be arranged in the set 102 separated from each other by one or more batteries of the set 102.

Dual-cell measurement circuit 100A includes a signal driver 105, a measurement circuit 110, a signal processing circuit 120. Signal driver 105 is attachable to batteries 104-2 and 104-3 and is arranged to selectively excite one of the two batteries 104-2 and 104-3 with a time varying signal while maintaining the other battery of the two batteries 104-2 and 104-3 in a non-excitation status. During this AC excitation, batteries 104-2 and 104-3 can be in operation having a common load current. The AC excitation can be generated in the range of 1 Hz to 10 kHz, depending on the impedance model used to process the input to signal processing circuit 120. Signal driver 105 can be coupled to battery 104-2 by a switch 112-2 and to battery 104-3 by a switch 112-3.

Switches 112-2 and 112-3 can be implemented in a number of different ways to provide a switching mechanism. Switches 112-2 and 112-3 can be realized using forms of field effect transistors (n-type or p-type), relays, forms of bipolar junction transistors (npn or pnp), or other suitable switches. Switches 112-2 and 112-3 can be implemented in a number of ways convenient for integrated circuit construction, for example, but not limited to, transistors arranged to be selectable between an on-mode or an off-mode. Internal resistances of switches 112-2 and 112-3 can provide some reasonably defined current level for exciting battery cells 104-2 and 104-3, respectively, during different portions of the dual-cell measurement. Optionally, a resistor 113-2 can be added in series with switch 112-2 and a resistor 113-3 can be added in series with switch 112-3. The amplitude of the excitation current, when switch 112-2 is on with switch 112-3 off, is given by the cell voltage of battery 104-2 divided by the series resistance 112-2. The amplitude of the excitation current, when switch 112-3 is on with switch 112-2 off, is given by the cell voltage of battery 104-3 divided by the series resistance 112-3. For ease of discussion of FIG. 1A, a control unit, other than signal driver 105, to control operation of switches 112-2 and 112-3 is not shown.

Measurement circuit 110 can be implemented as a circuit to measure voltage difference between voltage across battery 104-2 and voltage across battery 104-3, with battery 104-2 excited and with battery 104-3 of the two battery cells in the non-excitation status. During the monitoring of batteries 104-2 and 104-3 by the dual-cell approach, measurement circuit 110 also measures voltage difference between voltage across battery 104-2 and voltage across battery 104-3, with battery 104-3 excited and with battery 104-2 of the two battery cells in the non-excitation status. Measurement circuit 110 can include a subtraction node at which effects of $I_{LOAD}$, such as AC components of $I_{LOAD}$, and battery voltage are canceled with respect to battery 104-2 and battery 104-3, since $I_{LOAD}$ is common to battery 104-2 and battery 104-3, with these batteries having the same rated voltage. With battery 104-2 and battery 104-3 having the same cell voltage characteristics, the differential method of the dual-cell measurement technique allows for errors induced by the voltage levels of the similar batteries to be subtracted out, providing a cancellation of these induced errors.

Measurement circuit 110 can be coupled to battery 104-2, opposite switch 112-2, by a resistance 108-21 and a resistance 108-22. A capacitor 107-2 is coupled across inputs to measurement circuit 110 from battery 104-2, between resistance 108-21 and resistance 108-22 opposite the coupling of these resistances to battery 104-2. Measurement circuit 110 can be coupled to battery 104-3, opposite switch 112-3, by a resistance 108-31 and a resistance 108-32. A capacitor 107-3 is coupled across inputs to measurement circuit 110 from battery 104-3, between resistance 108-31 and resistance 108-32 opposite the coupling of these resistances to battery 104-3.

Signal processing circuit 120 can be configured to process the measured voltage difference from measurement circuit 110 to determine an electrical impedance of battery 104-2, in response to battery 104-2 excited with battery 104-3 non-excited. Signal processing circuit 120 can also process measured voltage difference from measurement circuit 110 to determine an electrical impedance of battery 104-3, in response to battery 104-3 excited with battery 104-2 non-excited. Electrical impedance of a battery can be calculated using a ratio between a drive signal applied in the dual-cell measurement circuit 100A and a detected signal in the dual-cell measurement circuit 100A in response to the application of the drive signal.

Signal processing circuit 120 can be implemented to provide one or more signals via line 125 to provide feedback or control to signal driver 105. Signal driver 105 can be structured to generate time varying signals at different frequencies with signal processing circuit 120 arranged to process measured voltage differences at the different frequencies to determine a frequency-dependent electrical impedance of battery 104-2. Signal driver 105 is operable to selectively excite battery 104-3 with a second time varying signal at different frequencies while maintaining battery 104-2 in a non-excitation status during the exciting of battery 104-3. Signal processing circuit 120 can be coupled to a clock 115 for processing or providing frequency control to signal driver 105. Signal processing circuit 120 can have an output to transmit digital data that represents the frequency-dependent electrical impedance of battery 104-2 or battery 104-3 over a bus to a processor at which one or more of a state of charge, a state of health, and an internal temperature of battery 104-3 or battery 104-2, respectively, are determined using the frequency-dependent electrical impedance.

Dual-cell measurement circuit 100A including signal driver 105, measurement circuit 110 to measure voltage difference, signal processing circuit 120, and other components can be disposed in an integrated circuit, with the integrated circuit attachable to battery 104-2 and battery 104-3. A device, which can include an integrated circuit containing a dual-cell measurement circuit, such as dual-cell measurement circuit 100A, can include multiple integrated circuits attached to multiple pairs of battery cells of a stack of battery cells with each integrated circuit coupled to one pair of battery cells different from battery cells coupled to other integrated circuits of the multiple integrated circuits. Such battery cells in the stack can be coupled in electrical series such that, in operation, the load current is common to each battery cell of the stack. Each integrated circuit structured, with respect to the pair of battery cells to which the integrated circuit is attached, can include a signal driver attachable to the pair of battery cells, a measurement circuit to measure voltage difference between voltage across one battery cell of the pair and voltage across the other battery cell of the pair, and a signal processing circuit to process the measured voltage difference to determine an electrical impedance of each of the battery cells of the pair. The signal driver can be arranged to selectively excite one battery cell of the pair of battery cells with a time varying signal while maintaining the other battery cell of the pair of battery cells in a non-excitation status during the exciting of the one battery cell of the pair. The measurement circuit measures the voltage difference with one battery cell of the pair excited and with the other battery cell of the pair in the non-excitation status. The signal processing circuit determines an electrical impedance of the one battery cell process from measuring voltage difference. Then, the signal driver can reverse the application of a time varying signal by exciting the battery cell of the pair of battery cells that was previously in a non-excitation status, while maintaining the previously excited battery of the pair in the non-excitation status. From the reversed application of a time varying signal, the electrical impedance of the other battery cell of the cell can be determined.

In the example of FIG. 1A, the set 102 of battery cells can be coupled to three integrated circuits as discussed above. An integrated circuit can be attached to the pair of batteries 104-0 and 104-1 to monitor these batteries and determine the electrical impedance of battery 104-0 and battery 104-1. An integrated circuit, as noted above, can be attached to the pair of batteries 104-2 and 104-3 to monitor these batteries and determine the electrical impedance of battery 104-2 and battery 104-3. An integrated circuit can be attached to the pair of batteries 104-4 and 104-5 to monitor these batteries and determine the electrical impedance of battery 104-4 and battery 104-5. In arrangements in which set 102 has more than six batteries, such arrangements can include more than three independent integrated circuits, for example N/2 integrated circuits where N is the number of batteries in the set 102, where N is a positive even integer. A sharing arrangement can be used for the set 102 having an odd number of batteries.

Figure 1B:
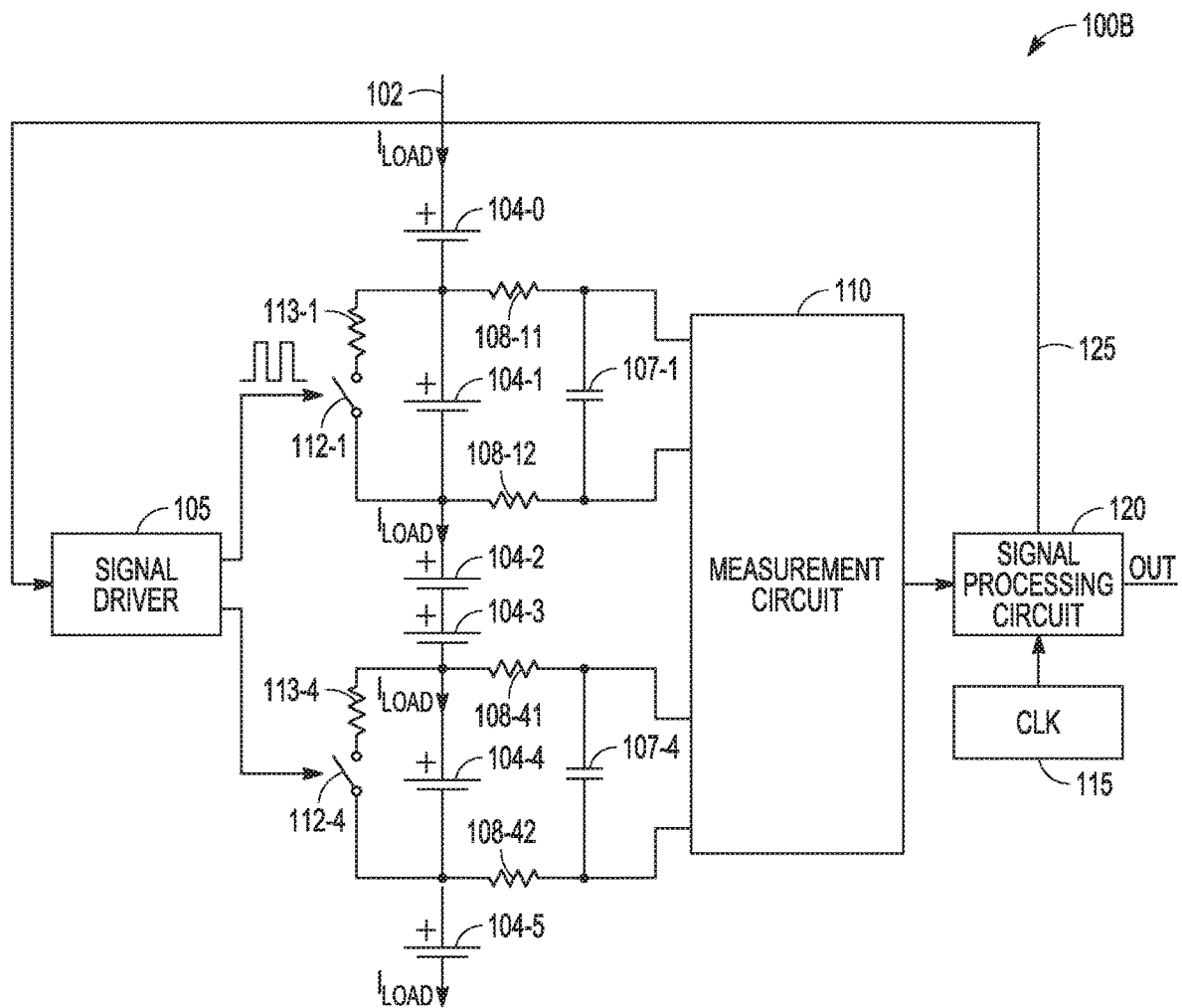
FIG. 1B illustrates an example dual-cell measurement circuit, which can be arranged in a device as a structure to measure battery parameters of two batteries, with the two batteries being arranged as non-neighboring cells in a stack of battery cells, according to various embodiments.

FIG. 1B illustrates an example dual-cell measurement circuit 100B, which can be arranged in a device as a structure to measure battery parameters of two batteries 104-1 and 104-4, with the two batteries being arranged as non-neighboring cells in a set 102 of battery cells. Dual-cell measurement circuit 100B can include the components of dual-cell measurement circuit 100A of FIG. 1A with these components coupled to two non-neighboring batteries, which in the example of FIG. 1B are batteries 104-1 and 104-4.

Dual-cell measurement circuit 100B is coupled to batteries 104-1 and 104-4 of set 102 of multiple batteries 104-0, 104-1, 104-2, 104-3, 104-4, and 104-5 to determine a battery parameter of the two batteries using a dual-cell approach. Dual-cell measurement circuit 100B can be coupled to battery 104-1 using four wires and to battery 104-4 using four wires, where the coupling can be within a housing for these batteries. With dual-cell measurement circuit 100B, battery 104-1 can be subjected to an AC excitation while battery 104-4 is not excited to measure a battery parameter of battery 104-1, where the two battery cells share a common load current. Operation of dual-cell measurement circuit 100B can include selecting battery 104-4 to be subjected to AC excitation while battery 104-1 is not excited, to measure a battery parameter of battery 104-4. The ordering of the measurement of the battery parameter of batteries 104-1 and 104-4 can be randomly selected or based on procedures of an architecture or system in which batteries 104-1 and 104-4 are deployed.

The set 102 of multiple batteries 104-0, 104-1, 104-2, 104-3, 104-4, and 104-5 can be realized as a stack of battery cells sharing a common load current $I_{LOAD}$ in operation. The batteries 104-0, 104-1, 104-2, 104-3, 104-4, and 104-5 can be arranged to operate with common $I_{LOAD}$ with the batteries 104-0, 104-1, 104-2, 104-3, 104-4, and 104-5 coupled in electrical series. Though FIG. 1B shows six batteries, the set 102 can be implemented as a set of battery cells having more or less than six batteries.

Dual-cell measurement circuit 100B includes a signal driver 105, a measurement circuit 110, a signal processing circuit 120. Signal driver 105 is attachable to batteries 104-1 and 104-4 and is arranged to selectively excite one of the two batteries 104-1 and 104-4 with a time varying signal while maintaining the other battery of the two batteries 104-1 and 104-4 in a non-excitation status. During this AC excitation, batteries 104-1 and 104-4 can be in operation having a common load current. The AC excitation can be generated in the range of 1 Hz to 10 kHz, depending on the impedance model used to process the input to signal processing circuit 120. Signal driver 105 can be coupled to battery 104-1 by a switch 112-1 and to battery 104-4 by a switch 112-4.

Switches 112-1 and 112-4 can be implemented in a number of different ways to provide a switching mechanism. Switches 112-1 and 112-4 can be realized using forms of field effect transistors (n-type or p-type), relays, forms of bipolar junction transistors (npn or pnp), or other suitable switches. Switches 112-1 and 112-4 can be implemented in a number of ways convenient for integrated circuit construction, for example, but not limited to, transistors arranged to be selectable between an on-mode or an off-mode. Internal resistances of switches 112-1 and 112-4 can provide some reasonably defined current level for exciting battery cells 104-1 and 104-4, respectively, during different portions of the dual-cell measurement. Optionally, a resistor 113-1 can be added in series with switch 112-1 and a resistor 113-4 can be added in series with switch 112-4. The amplitude of the excitation current, when switch 112-1 is on with switch 112-4 off, is given by the cell voltage of battery 104-1 divided by the series resistance 112-1. The amplitude of the excitation current, when switch 112-4 is on with switch 112-1 off, is given by the cell voltage of battery 104-4 divided by the series resistance 112-4. For ease of discussion of FIG. 1B, a control unit, other than signal driver 105, to control operation of switches 112-1 and 112-4 is not shown.

Measurement circuit 110 can be implemented as a circuit to measure voltage difference between voltage across battery 104-1 and voltage across battery 104-4, with battery 104-1 excited and with battery 104-4 of the two battery cells in the non-excitation status. During the monitoring of batteries 104-1 and 104-4 by the dual-cell approach, measurement circuit 110 also measures voltage difference between voltage across battery 104-1 and voltage across battery 104-4, with battery 104-4 excited and with battery 104-1 of the two battery cells in the non-excitation status. Measurement circuit 110 can include a subtraction node at which effects of $I_{LOAD}$, such as AC components of $I_{LOAD}$, and battery voltage are canceled with respect to battery 104-1 and battery 104-4, since $I_{LOAD}$ is common to battery 104-1 and battery 104-4, with these batteries having the same rated voltage. With battery 104-1 and battery 104-4 having the same cell voltage characteristics, the differential method of the dual-cell measurement technique allows for errors induced by the voltage levels of the similar batteries to be subtracted out, providing a cancellation of these induced errors.

Measurement circuit 110 can be coupled to battery 104-1, opposite switch 112-1, by a resistance 108-11 and a resistance 108-12. A capacitor 107-1 is coupled across inputs to measurement circuit 110 from battery 104-1, between resistance 108-11 and resistance 108-12 opposite the coupling of these resistances to battery 104-1. Measurement circuit 110 can be coupled to battery 104-4, opposite switch 112-4, by a resistance 108-41 and a resistance 108-42. A capacitor 107-4 is coupled across inputs to measurement circuit 110 from battery 104-4, between resistance 108-41 and resistance 108-42 opposite the coupling of these resistances to battery 104-4.

Signal processing circuit 120 can be configured to process the measured voltage difference from measurement circuit 110 to determine an electrical impedance of battery 104-1, in response to battery 104-1 excited with battery 104-4 non-excited. Signal processing circuit 120 can also process measured voltage difference from measurement circuit 110 to determine an electrical impedance of battery 104-4, in response to battery 104-4 excited with battery 104-1 non-excited. Electrical impedance of a battery can be calculated using a ratio between a drive signal applied in the dual-cell measurement circuit 100B and a detected signal in the dual-cell measurement circuit 100B in response to the application of the drive signal.

Signal processing circuit 120 can be implemented to provide one or more signals via line 125 to provide feedback or control to signal driver 105. Signal driver 105 can be structured to generate time varying signals at different frequencies with signal processing circuit 120 arranged to process measured voltage differences at the different frequencies to determine a frequency-dependent electrical impedance of battery 104-1. Signal driver 105 is operable to selectively excite battery 104-4 with a second time varying signal at different frequencies while maintaining battery 104-1 in a non-excitation status during the exciting of battery 104-4. Signal processing circuit 120 can be coupled to a clock 115 for processing or providing frequency control to signal driver 105. Signal processing circuit 120 can have an output to transmit digital data that represents the frequency-dependent electrical impedance of battery 104-1 or battery 104-4 over a bus to a processor at which one or more of a state of charge, a state of health, and an internal temperature of battery 104-1 or battery 104-4, respectively, are determined using the frequency-dependent electrical impedance.

Dual-cell measurement circuit 100B including signal driver 105, measurement circuit 110 to measure voltage difference, signal processing circuit 120, and other components can be disposed in an integrated circuit, with the integrated circuit attachable to battery 104-1 and battery 104-4. A device, which can include an integrated circuit containing a dual-cell measurement circuit, such as dual-cell measurement circuit 100B, can include multiple integrated circuits attached to multiple pairs of battery cells of a stack of battery cells with each integrated circuit coupled to one pair of battery cells different from battery cells coupled to other integrated circuits of the multiple integrated circuits. Such battery cells in the stack can be coupled in electrical series such that, in operation, the load current is common to each battery cell of the stack. Each integrated circuit structured, with respect to the pair of battery cells to which the integrated circuit is attached, can include a signal driver attachable to the pair of battery cells, a measurement circuit to measure voltage difference between voltage across one battery cell of the pair and voltage across the other battery cell of the pair, and a signal processing circuit to process the measured voltage difference to determine an electrical impedance of each of the battery cells of the pair. The signal driver can be arranged to selectively excite one battery cell of the pair of battery cells with a time varying signal while maintaining the other battery cell of the pair of battery cells in a non-excitation status during the exciting of the one battery cell of the pair. The measurement circuit measures the voltage difference with one battery cell of the pair excited and with the other battery cell of the pair in the non-excitation status. The signal processing circuit determines an electrical impedance of the one battery cell process from measuring voltage difference. Then, the signal driver can reverse the application of a time varying signal by exciting the battery cell of the pair of battery cells that was previously in a non-excitation status, while maintaining the previously excited battery of the pair in the non-excitation status. From the reversed application of a time varying signal, the electrical impedance of the other battery cell of the cell can be determined.

In the example of FIG. 1B, the set 102 of battery cells can be coupled to three integrated circuits as discussed above. An integrated circuit can be attached to the pair of batteries 104-0 and 104-2 to monitor these batteries and determine the electrical impedance of battery 104-0 and battery 104-2. An integrated circuit, as noted above, can be attached to the pair of batteries 104-1 and 104-4 to monitor these batteries and determine the electrical impedance of battery 104-1 and battery 104-4. An integrated circuit can be attached to the pair of batteries 104-3 and 104-5 to monitor these batteries and determine the electrical impedance of battery 104-3 and battery 104-5. In arrangements in which set 102 has more than six batteries, such arrangements can include more than three independent integrated circuits, for example N/2 integrated circuits where N is the number of batteries in the set 102, where N is a positive even integer. A sharing arrangement can be used for the set 102 having an odd number of batteries.

Figure 2:
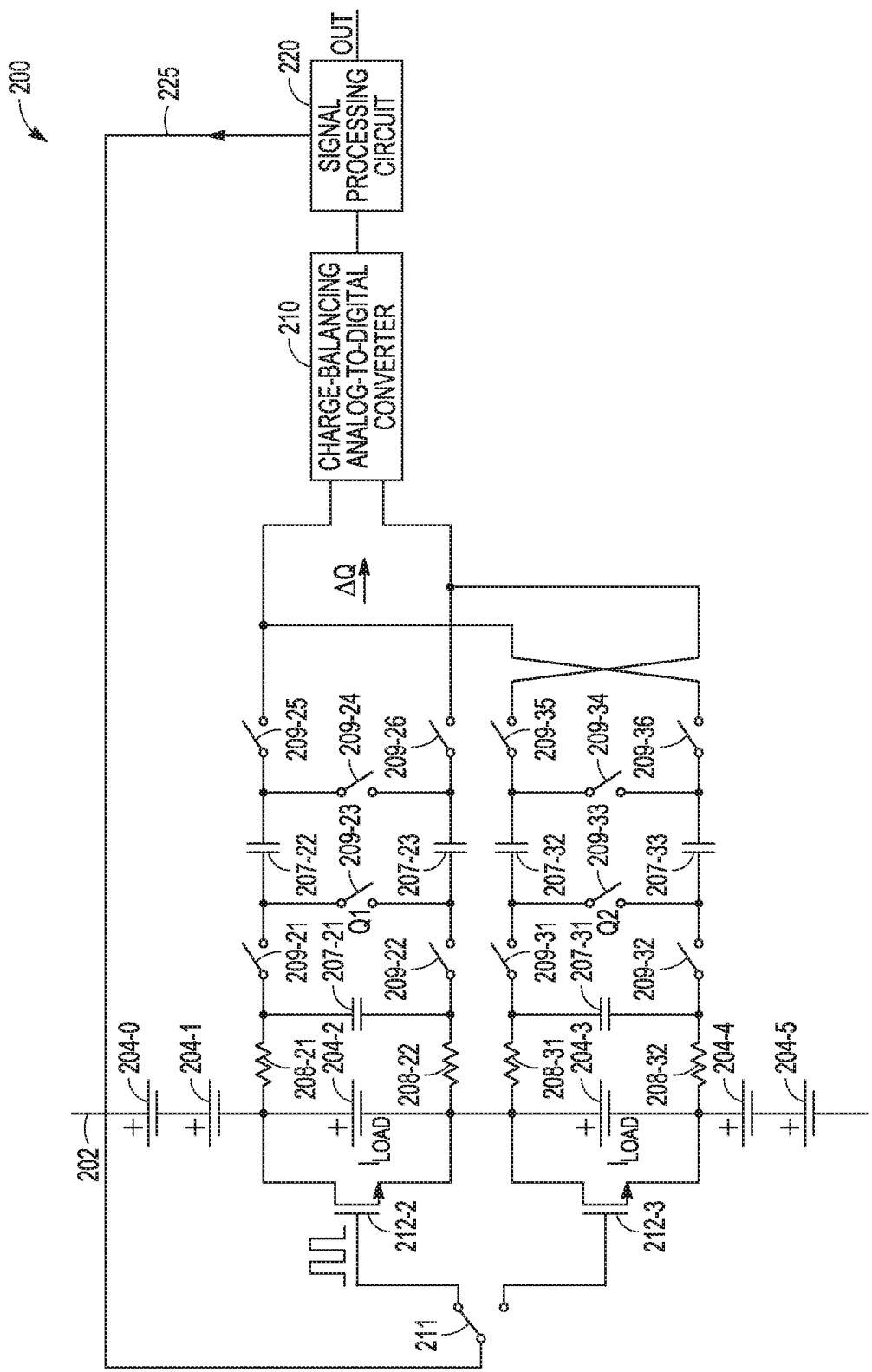
FIG. 2 is illustrates an example dual-cell measurement circuit having a switched capacitor circuit to measure battery parameters of two batteries, according to various embodiments.

FIG. 2 illustrates an embodiment of an example dual-cell measurement circuit 200 having a switched capacitor circuit to sample a battery cell 204-2 and a battery cell 204-3. Dual-cell measurement circuit 200 can be arranged in a device as a structure to measure battery parameters of the two batteries 204-2 and 204-3. The switched capacitor circuit, providing a sampling network, can provide a straightforward way to compute the difference of both cell voltages by sampling the cells at high frequency. The sampling capacitors of the switched capacitor circuit can connect to a charge-balancing ADC 210 such that substantially only the charge difference ΔQ gets processed. This could also be performed with a continuous-time system using resistors and a transconductance (gm) stage. With fast sampling or continuous-time compensation, the load current is compensated near instantaneously with very high timing precision. This approach is much better than using two separate, slower ADCs that may be at different points in the system.

As shown in FIG. 2, dual-cell measurement circuit 200 is coupled to batteries 204-2 and 204-3 of a set 202 of multiple batteries 204-0, 204-1, 204-2, 204-3, 204-4, and 204-5 to determine a battery parameter of the two batteries 204-2 and 204-3 using a dual-cell approach. Dual-cell measurement circuit 200 can be coupled to battery 204-2 using four wires and to battery 204-3 using four wires, where the coupling can be within a housing for these batteries. With dual-cell measurement circuit 200 arranged to measure a battery parameter of battery 204-2, battery 204-2 can be subjected to an AC excitation while battery 204-3 is not excited, where the two battery cells share a common load current. Operation of dual-cell measurement circuit 200 can include selecting battery 204-3 to be subjected to AC excitation, while battery 204-2 is not excited, to measure a battery parameter of battery 204-3. The ordering of the measurement of the battery parameter of batteries 204-2 and 204-3 can be randomly selected or based on procedures of an architecture or system in which batteries 204-2 and 204-3 are deployed. Control of measuring the battery parameters of batteries 204-2 and 204-3 can be accomplished via a signal processing circuit 220.

The set 202 of multiple batteries 204-0, 204-1, 204-2, 204-3, 204-4, and 204-5 can be realized as a stack of battery cells sharing a common load current $I_{LOAD}$ in operation. The batteries 204-0, 204-1, 204-2, 204-3, 204-4, and 204-5 can be arranged to operate with a common $I_{LOAD}$ with the batteries 204-0, 204-1, 204-2, 204-3, 204-4, and 204-5 coupled in electrical series. Though FIG. 2 shows six batteries, the set 202 can be implemented as a set of battery cells having more or less than six batteries. Batteries 204-2 and 204-3 can be arranged as directly adjacent cells in the set 202 arranged as a stack of battery cells with the batteries 204-0, 204-1, 204-2, 204-3, 204-4, and 204-5 arranged in series such that, in operation, $I_{LOAD}$ is common to each battery of the stack. Alternatively, batteries 204-2 and 204-3 can be arranged in the set 202 separated from each other by one or more batteries of the set 202.

Signal processing circuit 220 can generate one or more signals to selectively excite one of the two batteries 204-2 and 204-3 with a time varying signal, while maintaining the other battery of the two batteries 204-2 and 204-3 in a non-excitation status. During this AC excitation, batteries 204-2 and 204-3 can be in operation having a common $I_{LOAD}$. Signal processing circuit 220 is coupled to a switch 211 that selectively couples signal processing circuit 220 to a transistor 212-2 or to a transistor 212-3. Switch 211 can be realized using forms of field effect transistors (n-type or p-type), relays, forms of bipolar junction transistors (npn or pnp), or other suitable switches. Signal processing circuit 220 can be implemented to provide one or more signals to switch 211 via a line 225. Though transistors 212-2 and 212-3 can be implemented in various forms of transistors such as forms of field effect transistors (n-type or p-type), relays, forms of bipolar junction transistors (npn or pnp), or other suitable switching devices, the example of FIG. 2 uses n-channel insulated-gate field effect transistors. Optionally, a resistor can be added in series with transistor 212-2 and a resistor can be added in series with transistor 212-3. The amplitude of the excitation current, when transistor 212-2 is on with transistor 212-3 off, is given by the cell voltage of battery 204-2 divided by the resistance in series with transistor 212-2. The amplitude of the excitation current, when transistor 212-3 is on with transistor 212-2 off, is given by the cell voltage of battery 204-3 divided by the resistance in series with transistor 212-3. Battery 204-2 is coupled to transistor 212-2 of dual-cell measurement circuit 200 with its drain coupled to one terminal of battery 204-2 and its source coupled to another terminal of battery 204-2. Battery 204-3 is coupled to transistor 212-3 of dual-cell measurement circuit 200 with its drain coupled to one terminal of battery 204-3 and its source coupled to another terminal of battery 204-3.

Battery 204-2 can be coupled, opposite transistor 212-2, to a resistance 208-21 and a resistance 208-22 of dual-cell measurement circuit 200. A capacitor 207-21 is coupled between resistance 208-21 and resistance 208-22 opposite the coupling of these resistances to battery 204-2. The two nodes of the connection of capacitor 207-21 to resistance 208-21 and resistance 208-22 are coupled to a portion of a switched capacitor circuit to measure a charge Q1. The portion of the switched capacitor circuit includes switches 209-21, 209-22, 209-23, 209-24, 209-25, and 209-26 along with capacitors 207-22 and 207-23. This portion of the switched capacitor circuit is coupled to two inputs of charge-balancing ADC 210 via the switches 209-25 and 209-26. Capacitor 207-22 is coupled between switches 209-21 and 209-25 and capacitor 207-23 is coupled between switches 209-22 and 209-23. Capacitor 207-22 is coupled to capacitor 207-23 using switches 209-23 and 209-24.

Battery 204-3 can be coupled, opposite transistor 212-3, to a resistance 208-31 and a resistance 208-32 of dual-cell measurement circuit 200. A capacitor 207-31 is coupled between resistance 208-31 and resistance 208-32 opposite the coupling of these resistances to battery 204-3. The two nodes of the connection of capacitor 207-31 to resistance 208-31 and resistance 208-32 are coupled to a portion of the switched capacitor circuit to measure a charge Q2. This portion of the switched capacitor circuit includes switches 209-31, 209-32, 209-33, 209-34, 209-35, and 209-36 along with capacitors 207-32 and 207-33. This portion of the switched capacitor circuit is coupled to two inputs of charge-balancing ADC 210 via the switches 209-35 and 209-36. Capacitor 207-32 is coupled between switches 209-31 and 209-35 and capacitor 207-33 is coupled between switches 209-32 and 209-33. Capacitor 207-32 is coupled to capacitor 207-33 using switches 209-33 and 209-34. Switches 209-35 and 209-36 associated with battery 204-3 are coupled to switches 209-25 and 209-26 and charge-balancing ADC 210 opposite with respect to the polarities of batteries 204-3 and 204-2, respectively, such that substantially only the charge difference ΔQ gets processed. Effects of $I_{LOAD}$, such as AC components of the load current, and battery voltage are canceled with respect to battery 204-2 and battery 204-3, since $I_{LOAD}$ is common to battery 204-2 and battery 204-3, with these batteries having the same rated voltage.

Switches 211, 209-21 . . . 209-26, and 209-31 . . . 209-36 can be implemented in a number of different ways to provide switching mechanisms. These switches can be implemented in a number of ways convenient for integrated circuit construction, for example, but not limited to, transistors arranged to be selectable between an on-mode or an off-mode. Though not shown, control signals to these switches can be provided by signal processing circuit 220 or other control unit. Switches 209-21 . . . 209-26, and 209-31 . . . 209-36 of the switched capacitor circuit can be operated at about 1 MHz or other relatively high rate, while the AC excitation can be in the range of 1 Hz to 10 kHz or other range.

Signal processing circuit 220 can be configured to process input from charge-balancing ADC 210 to determine an electrical impedance of battery 204-2, in response to battery 204-2 excited with battery 204-3 non-excited. Signal processing circuit 220 can also process input from charge-balancing ADC 210 to determine an electrical impedance of battery 204-3, in response to battery 204-3 excited with battery 204-2 non-excited. Electrical impedance of a battery can be calculated using a ratio between a drive signal applied in the dual-cell measurement circuit 200 and a detected signal in the dual-cell measurement circuit 200 in response to the application of the drive signal. Signal processing circuit 220 can be structured to generate time varying signals at different frequencies with signal processing circuit 220 arranged to process input from charge-balancing ADC 210 to determine an electrical impedance of battery 204-2. Signal processing circuit 220 is operable to selectively excite battery 204-3 with a second time varying signal at different frequencies while maintaining battery 204-2 in a non-excitation status during the exciting of battery 204-3. Signal processing circuit 220 can be arranged to transmit digital data that represents the frequency-dependent electrical impedance of battery 204-2 or battery 204-3 over a bus to a processor at which one or more of a state of charge, a state of health, and an internal temperature of battery 204-3 or battery 204-2, respectively, are determined using the frequency-dependent electrical impedance.

Dual-cell measurement circuit 200 including charge-balancing ADC 210, signal processing circuit 220, and other components can be disposed in an integrated circuit, with the integrated circuit attachable to battery 204-2 and battery 204-3. A device, which can include an integrated circuit containing a dual-cell measurement circuit, such as dual-cell measurement circuit 200, can include multiple integrated circuits attached to multiple pairs of battery cells of a stack of battery cells with each integrated circuit coupled to one pair of battery cells different from battery cells coupled to other integrated circuits of the multiple integrated circuits. Such battery cells in the stack can be coupled in electrical series such that, in operation, the load current is common to each battery cell of the stack. Each integrated circuit structured, with respect to the pair of battery cells to which the integrated circuit is attached, can include a charge-balancing ADC, a switched capacitor circuit, and a signal processing circuit to determine an electrical impedance of each of the battery cells of the pair. The signal processing circuit can be arranged to selectively excite one battery cell of the pair of battery cells with a time varying signal while maintaining the other battery cell of the pair of battery cells in a non-excitation status during the exciting of the one battery cell of the pair. The charge-balancing ADC measures a charge difference with one battery cell of the pair excited and with the other battery cell of the pair in the non-excitation status. The signal processing circuit determines an electrical impedance of the one battery cell from measuring voltage charge. Then, the signal processing circuit can reverse the application of a time varying signal by exciting battery cell of the pair of battery cells that was previously in a non-excitation status, while maintaining the previously excited battery of the pair in the non-excitation status. From the reversed application of a time varying signal, the electrical impedance of the other battery cell of the pair of battery cells can be determined.

In the example of FIG. 2, the set 202 of battery cells can be coupled to three integrated circuits as discussed above. An integrated circuit can be attached to the pair of batteries 204-0 and 204-1 to monitor these batteries and determine the electrical impedance of battery 204-0 and battery 204-1. An integrated circuit, as noted above, can be attached to the pair of batteries 204-2 and 204-3 to monitor these batteries and determine the electrical impedance of battery 204-2 and battery 204-3. An integrated circuit can be attached to the pair of batteries 204-4 and 204-5 to monitor these batteries and determine the electrical impedance of battery 204-4 and battery 204-5. In arrangements in which set 202 has more than six batteries, such arrangements can include more than three independent integrated circuits, for example N/2 integrated circuits where N is the number of batteries in the set 202, where N is a positive even integer. A sharing arrangement can be used for the set 202 having an odd number of batteries.

Figure 3:
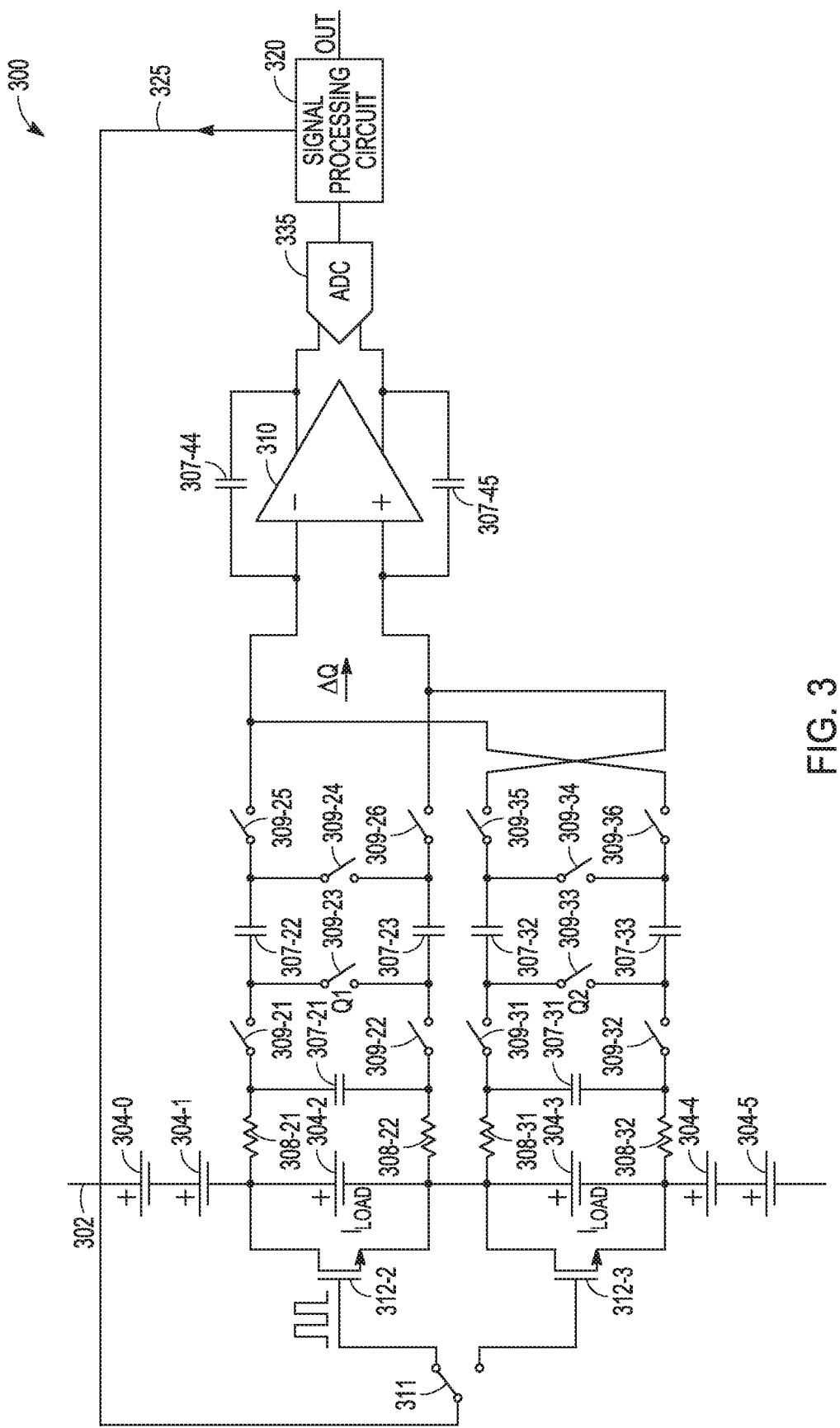
FIG. 3 illustrates an example dual-cell measurement circuit having a switched capacitor circuit and a charge integrator to measure battery parameters of two batteries, according to various embodiments.

FIG. 3 illustrates an embodiment of an example dual-cell measurement circuit 300 having a switched capacitor circuit and a charge integrator to measure parameters of battery cell 304-2 and a battery cell 304-3. The switched capacitor circuit, providing a sampling network, can provide a straightforward way to compute the difference of both cell voltages by sampling the cells at high frequency. The sampling capacitors of the switched capacitor circuit can connect to a charge integrator 310 with opposite polarity such that substantially only the charge difference ΔQ gets processed. This could also be performed with a continuous-time system using resistors and a gm stage. With fast sampling or continuous-time compensation, the load current is compensated near instantaneously with very high timing precision. This approach is much better than using two separate, slower ADCs that may be at different points in the system.

As shown in FIG. 3, dual-cell measurement circuit 300 is coupled to batteries 304-2 and 304-3 of a set 302 of multiple batteries 304-0, 304-1, 304-2, 304-3, 304-4, and 304-5 to determine a battery parameter of the two batteries 304-2 and 304-3 using a dual-cell approach. Dual-cell measurement circuit 300 can be coupled to battery 304-2 using four wires and to battery 304-3 using four wires, where the coupling can be within a housing for these batteries. With dual-cell measurement circuit 300 arranged to measure a battery parameter of battery 304-2, battery 304-2 can be subjected to an AC excitation while battery 304-3 is not excited, where the two battery cells share a common load current. Operation of dual-cell measurement circuit 300 can include selecting battery 304-3 to be subjected to AC excitation, while battery 304-2 is not excited, to measure a battery parameter of battery 304-3. The ordering of the measurement of the battery parameter of batteries 304-2 and 304-3 can be randomly selected or based on procedures of an architecture or system in which batteries 304-2 and 304-3 are deployed. Control of measuring the battery parameters of batteries 304-2 and 304-3 can be accomplished via a drive/demodulation circuit 320.

The set 302 of multiple batteries 304-0, 304-1, 304-2, 304-3, 304-4, and 304-5 can be realized as a stack of battery cells sharing a common load current $I_{LOAD}$ in operation. The batteries 304-0, 304-1, 304-2, 304-3, 304-4, and 304-5 can be arranged to operate with a common load current with the batteries 304-0, 304-1, 304-2, 304-3, 304-4, and 304-5 coupled in electrical series. Though FIG. 3 shows six batteries, the set 302 can be implemented as a set of battery cells having more or less than six batteries. Batteries 304-2 and 304-3 can be arranged as directly adjacent cells in the set 302 arranged as a stack of battery cells with the batteries 304-0, 304-1, 304-2, 304-3, 304-4, and 304-5 arranged in series such that, in operation, the load current is common to each battery of the stack. Alternatively, batteries 304-2 and 304-3 can be arranged in the set 302 separated from each other by one or more batteries of the set 302.

Drive/demodulation circuit 320 can generate one or more signals to selectively excite one of the two batteries 304-2 and 304-3 with a time varying signal, while maintaining the other battery of the two batteries 304-2 and 304-3 in a non-excitation status. During this AC excitation, batteries 304-2 and 304-3 can be in operation having a common load current. Drive/demodulation circuit 320 is coupled to switch 311 that selectively couples drive/demodulation circuit 320 to a transistor 312-2 or to a transistor 312-3. Switch 311 can be realized using forms of field effect transistors (n-type or p-type), relays, forms of bipolar junction transistors (npn or pnp), or other suitable switches. Drive/demodulation circuit 320 can be implemented to provide one or more signals to switch 311 via a line 325. Though transistors 312-2 and 312-3 can be implemented in various forms of transistors such as forms of field effect transistors (n-type or p-type), relays, forms of bipolar junction transistors (npn or pnp), or other suitable switching devices, the example of FIG. 3 uses n-channel insulated-gate field effect transistors. Optionally, a resistor can be added in series with transistor 312-2 and a resistor can be added in series with transistor 312-3. The amplitude of the excitation current, when transistor 312-2 is on with transistor 312-3 off, is given by the cell voltage of battery 304-2 divided by the resistance in series with transistor 312-2. The amplitude of the excitation current, when transistor 312-3 is on with transistor 312-2 off, is given by the cell voltage of battery 304-3 divided by the resistance in series with transistor 312-3. Battery 304-2 is coupled to transistor 312-2 of dual-cell measurement circuit 300 with its drain coupled to one terminal of battery 304-2 and its source coupled to another terminal of battery 304-2. Battery 304-3 is coupled to transistor 312-3 of dual-cell measurement circuit 300 with its drain coupled to one terminal of battery 304-3 and its source coupled to another terminal of battery 304-3.

Battery 304-2 can be coupled, opposite transistor 312-2, to a resistance 308-21 and a resistance 308-22 of dual-cell measurement circuit 300. A capacitor 307-21 is coupled between resistance 308-21 and resistance 308-22 opposite the coupling of these resistances to battery 304-2. The two nodes of the connection of capacitor 307-21 to resistance 308-21 and resistance 308-22 are coupled to a portion of a switched capacitor circuit to measure a charge Q1. This portion of the switched capacitor circuit includes switches 309-21, 309-22, 309-23, 309-24, 309-25, and 309-26 along with capacitors 307-22 and 307-23. This portion of the switched capacitor circuit is coupled to two inputs of charge integrator 310 via the switches 309-25 and 309-26. Capacitor 307-22 is coupled between switches 309-21 and 309-25 and capacitor 307-23 is coupled between switches 309-22 and 309-23. Capacitor 307-22 is coupled to capacitor 307-23 using switches 309-23 and 309-24.

Battery 304-3 can be coupled, opposite transistor 312-3, to a resistance 308-31 and a resistance 308-32 of dual-cell measurement circuit 300. A capacitor 307-31 is coupled between resistance 308-31 and resistance 308-32 opposite the coupling of these resistances to battery 304-3. The two nodes of the connection of capacitor 307-31 to resistance 308-31 and resistance 308-32 are coupled to a portion of the switched capacitor circuit to measure a charge Q2. This portion of the switched capacitor circuit includes switches 309-31, 309-32, 309-33, 309-34, 309-35, and 309-36 along with capacitors 307-32 and 307-33. Capacitor 307-32 is coupled between switches 309-31 and 309-35 and capacitor 307-33 is coupled between switches 309-32 and 309-33. Capacitor 307-32 is coupled to capacitor 307-33 using switches 309-33 and 309-34. This portion of the switched capacitor circuit is coupled to two inputs of charge integrator 310 via the switches 309-35 and 309-36. Switches 309-35 and 309-36 are coupled to switches 309-26 and 309-25, respectively, and charge integrator 310 with opposite polarity such that substantially only the charge difference ΔQ gets processed. Effects of $I_{LOAD}$, such as AC components of the load current, and battery voltage are canceled with respect to battery 304-2 and battery 304-3, since $I_{LOAD}$ is common to battery 304-2 and battery 304-3, with these batteries having the same rated voltage.

Switches 311, 309-21 . . . 309-26, and 309-31 . . . 309-36 can be implemented in a number of different ways to provide a switching mechanism. These switches can be implemented in a number of ways convenient for integrated circuit construction, for example, but not limited to, transistors arranged to be selectable between an on-mode or an off-mode. Though not shown, control signals to these switches can be provided by signal processing circuit 320 or other control unit. Switches 309-21 . . . 309-26, and 309-31 . . . 309-36 of the switched capacitor circuit can be operated at about 1 MHz or other relatively high rate, while the AC excitation can be in the range of 1 Hz to 10 kHz or other range.

Charge integrator 310 is an integrator circuit to integrate charge difference from sampling capacitors of the switched capacitor circuit connected with opposite polarity to the integrator circuit. An input of charge integrator 310 is coupled to one end of a capacitor 307-44 and an output of charge integrator 310 is coupled to another end of capacitor 307-44. Another input of charge integrator 310 is coupled to one end of a capacitor 307-45 and another output of charge integrator 310 is coupled to another end of capacitor 307-45. These two outputs of charge integrator 310 are coupled to an ADC 335 at two different inputs of ADC 335. An output of ADC 335 is coupled to an input of drive/demodulation circuit 320. This arrangement of charge integrator 310 and ADC 335 can provide a charge-balancing ADC circuit that can operate similar to charge-balancing ADC 210 of FIG. 2. Drive/demodulation circuit 320 can be implemented similar to signal processing circuit 220 of FIG. 2.

Drive/demodulation circuit 320 can be configured to process input from ADC 335 to determine an electrical impedance of battery 304-2, in response to battery 304-2 excited with battery 304-3 non-excited. Drive/demodulation circuit 320 can also process input from ADC 335 to determine an electrical impedance of battery 304-3, in response to battery 304-3 excited with battery 304-2 non-excited. Electrical impedance of a battery can be calculated using a ratio between a drive signal applied in the dual-cell measurement circuit 300 and a detected signal in the dual-cell measurement circuit 300 in response to the application of the drive signal. Drive/demodulation circuit 320 can be structured to generate time varying signals at different frequencies with drive/demodulation circuit 320 arranged to process input from ADC 335 to determine an electrical impedance of battery 304-2. Drive/demodulation circuit 320 is operable to selectively excite battery 304-3 with a second time varying signal at different frequencies while maintaining battery 304-2 in a non-excitation status during the exciting of battery 304-3. Drive/demodulation circuit 320 can have an output to transmit digital data that represents the frequency-dependent electrical impedance of battery 304-2 or battery 304-3 over a bus to a processor at which one or more of a state of charge, a state of health, and an internal temperature of battery 304-3 or battery 304-2, respectively, are determined using the frequency-dependent electrical impedance.

Dual-cell measurement circuit 300 including charge integrator 310, ADC 335, drive/demodulation circuit 320, and other components can be disposed in an integrated circuit, with the integrated circuit attachable to battery 304-2 and battery 304-3. A device, which can include an integrated circuit containing a dual-cell measurement circuit, such as dual-cell measurement circuit 300, can include multiple integrated circuits attached to multiple pairs of battery cells of a stack of battery cells with each integrated circuit coupled to one pair of battery cells different from battery cells coupled to other integrated circuits of the multiple integrated circuits. Such battery cells in the stack can be coupled in electrical series such that, in operation, the load current is common to each battery cell of the stack. Each integrated circuit structured, with respect to the pair of battery cells to which the integrated circuit is attached, can include a charge integrator, an ADC, a switched capacitor circuit, and a drive/demodulation circuit to determine an electrical impedance of each of the battery cells of the pair. The drive/demodulation circuit can be arranged to selectively excite one battery cell of the pair of battery cells with a time varying signal while maintaining the other battery cell of the pair of battery cells in a non-excitation status during the exciting of the one battery cell of the pair. The charge integrator can measure a charge difference with one battery cell of the pair excited and with the other battery cell of the pair in the non-excitation status. The drive/demodulation circuit can determine an electrical impedance of the one battery cell from measuring voltage charge. Then, the drive/demodulation circuit can reverse the application of a time varying signal by exciting battery cell of the pair of battery cells that was previously in a non-excitation status, while maintaining the previously excited battery of the pair in the non-excitation status. From the reversed application of a time varying signal, the electrical impedance of the other battery cell of the cell can be determined.

In the example of FIG. 3, the set 302 of battery cells can be coupled to three integrated circuits as discussed above. An integrated circuit can be attached to the pair of batteries 304-0 and 304-1 to monitor these batteries and determine the electrical impedance of battery 304-0 and battery 304-1. An integrated circuit, as noted above, can be attached to the pair of batteries 304-2 and 304-3 to monitor these batteries and determine the electrical impedance of battery 304-2 and battery 304-3. An integrated circuit can be attached to the pair of batteries 304-4 and 304-5 to monitor these batteries and determine the electrical impedance of battery 304-4 and battery 304-5. In arrangements in which set 302 has more than six batteries, such arrangements can include more than three independent integrated circuits, for example N/2 integrated circuits where N is the number of batteries in the set 302, where N is a positive even integer. A sharing arrangement can be used for the set 302 having an odd number of batteries.

Figure 4:
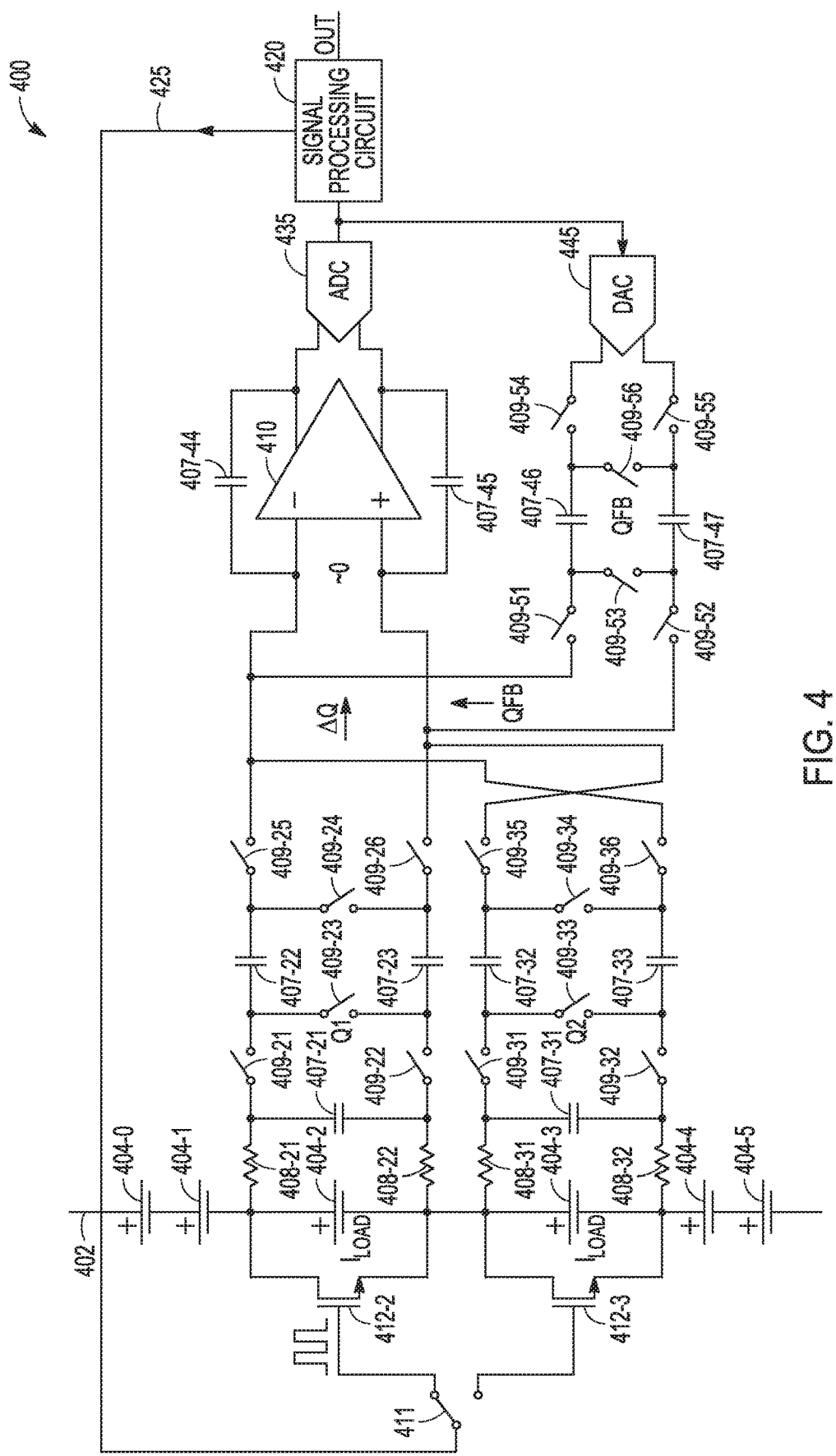
FIG. 4 illustrates an example dual-cell measurement circuit having a switched capacitor circuit and a charge integrator with feedback to measure battery parameters of two batteries, according to various embodiments.

FIG. 4 illustrates an embodiment of an example dual-cell measurement circuit 400 having a switched capacitor circuit and a charge integrator with feedback to measure parameters of battery cell 404-2 and a battery cell 404-3. The switched capacitor circuit, providing a sampling network, can provide a straightforward way to compute the difference of both cell voltages by sampling the cells at high frequency. The sampling capacitors of the switched capacitor circuit can connect to a charge integrator 410 with opposite polarity such that substantially only the charge difference ΔQ gets processed. This could also be performed with a continuous-time system using resistors and a gm stage. With fast sampling or continuous-time compensation, the load current is compensated near instantaneously with very high timing precision. This approach is much better than using two separate, slower ADCs that may be at different points in the system. A feedback loop back to charge integrator 410 can regulate a feedback charge QFB to approximate an inverse of the difference of battery cell charge. Charge integrator 410 can drive the feedback so as to regulate its average input to substantially zero.

As shown in FIG. 4, dual-cell measurement circuit 400 is coupled to batteries 404-2 and 404-3 of a set 402 of multiple batteries 404-0, 404-1, 404-2, 404-3, 404-4, and 404-5 to determine a battery parameter of the two batteries 404-2 and 404-3 using a dual-cell approach. Dual-cell measurement circuit 400 can be coupled to battery 404-2 using four wires and to battery 404-3 using four wires, where the coupling can be within a housing for these batteries. With dual-cell measurement circuit 400 arranged to measure a battery parameter of battery 404-2, battery 404-2 can be subjected to an AC excitation while battery 404-3 is not excited, where the two battery cells share a common load current. Operation of dual-cell measurement circuit 400 can include selecting battery 404-3 to be subjected to AC excitation, while battery 404-2 is not excited, to measure a battery parameter of battery 404-3. The ordering of the measurement of the battery parameter of batteries 404-2 and 404-3 can be randomly selected or based on procedures of an architecture or system in which batteries 404-2 and 404-3 are deployed. Control of measuring the battery parameters of batteries 404-2 and 404-3 can be accomplished via a signal processing circuit 420.

The set 402 of multiple batteries 404-0, 404-1, 404-2, 404-3, 404-4, and 404-5 can be realized as a stack of battery cells sharing a common load current $I_{LOAD}$ in operation. The batteries 404-0, 404-1, 404-2, 404-3, 404-4, and 404-5 can be arranged to operate with a common $I_{LOAD}$ with the batteries 404-0, 404-1, 404-2, 404-3, 404-4, and 404-5 coupled in electrical series. Though FIG. 4 shows six batteries, the set 402 can be implemented as a set of battery cells having more or less than six batteries. Batteries 404-2 and 404-3 can be arranged as directly adjacent cells in the set 402 arranged as a stack of battery cells with the batteries 404-0, 404-1, 404-2, 404-3, 404-4, and 404-5 arranged in series such that, in operation, the load current is common to each battery of the stack. Alternatively, batteries 404-2 and 404-3 can be arranged in the set 402 separated from each other by one or more batteries of the set 402.

Signal processing circuit 420 can generate one or more signals to selectively excite one of the two batteries 404-2 and 404-3 with a time varying signal, while maintaining the other battery of the two batteries 404-2 and 404-3 in a non-excitation status. During this AC excitation, batteries 404-2 and 404-3 can be in operation having a common load current. Signal processing circuit 420 is coupled to switch 411 that selectively couples signal processing circuit 420 to a transistor 412-2 or to a transistor 412-3. Switch 411 can be realized using forms of field effect transistors (n-type or p-type), relays, forms of bipolar junction transistors (npn or pnp), or other suitable switches. Signal processing circuit 420 can be implemented to provide one or more signals to switch 411 via a line 425. Though transistors 412-2 and 412-3 can be implemented in various forms of transistors such as forms of field effect transistors (n-type or p-type), relays, forms of bipolar junction transistors (npn or pnp), or other suitable switching devices, the example of FIG. 4 uses n-channel insulated-gate field effect transistors. Optionally, a resistor can be added in series with transistor 412-2 and a resistor can be added in series with transistor 412-3. The amplitude of the excitation current, when transistor 412-2 is on with transistor 412-3 off, is given by the cell voltage of battery 404-2 divided by the resistance in series with transistor 412-2. The amplitude of the excitation current, when transistor 412-3 is on with transistor 412-2 off, is given by the cell voltage of battery 404-3 divided by the resistance in series with transistor 412-3. Battery 404-2 is coupled to transistor 412-2 of dual-cell measurement circuit 400 with its drain coupled to one terminal of battery 404-2 and its source coupled to another terminal of battery 404-2. Battery 404-3 is coupled to transistor 412-3 of dual-cell measurement circuit 400 with its drain coupled to one terminal of battery 404-3 and its source coupled to another terminal of battery 404-3.

Battery 404-2 can be coupled, opposite transistor 412-2, to a resistance 408-21 and a resistance 408-22 of dual-cell measurement circuit 400. A capacitor 407-21 is coupled between resistance 408-21 and resistance 408-22 opposite the coupling of these resistances to battery 404-2. The two nodes of the connection of capacitor 407-21 to resistance 408-21 and resistance 408-22 are coupled to a portion of a switched capacitor circuit to measure a charge Q1. This portion of the switched capacitor circuit includes switches 409-21, 409-22, 409-23, 409-24, 409-25, and 409-26 along with capacitors 407-22 and 407-23. This portion of the switched capacitor circuit is coupled to two inputs of charge integrator 410 via the switches 409-25 and 409-26. Capacitor 407-22 is coupled between switches 409-21 and 409-25 and capacitor 407-23 is coupled between switches 409-22 and 409-23. Capacitor 407-22 is coupled to capacitor 407-23 using switches 409-23 and 409-24.

Battery 404-3 can be coupled, opposite transistor 412-3, to a resistance 408-31 and a resistance 408-32 of dual-cell measurement circuit 400. A capacitor 407-31 is coupled between resistance 408-31 and resistance 408-32 opposite the coupling of these resistances to battery 404-3. The two nodes of the connection of capacitor 407-31 to resistance 408-31 and resistance 408-32 are coupled to a portion of the switched capacitor circuit to measure a charge Q2. This portion of the switched capacitor circuit includes switches 409-31, 409-32, 409-33, 409-34, 409-35, and 409-36 along with capacitors 407-32 and 407-33. This portion of the switched capacitor circuit is coupled to two inputs of charge integrator 410 via the switches 409-35 and 409-36. Capacitor 407-32 is coupled between switches 409-31 and 409-35 and capacitor 407-33 is coupled between switches 409-32 and 409-33. Capacitor 407-32 is coupled to capacitor 407-33 using switches 409-33 and 409-34. Switches 409-35 and 409-36 are coupled to switches 409-26 and 409-25, respectively, and charge integrator 410 with opposite polarity such that substantially only the charge difference ΔQ from the switched capacitor circuit gets processed. Effects of $I_{LOAD}$, such as AC components of the load current, and battery voltage are canceled with respect to battery 404-2 and battery 404-3, since $I_{LOAD}$ is common to battery 404-2 and battery 404-3, with these batteries having the same rated voltage.

Switches 411, 409-21 . . . 409-26, and 409-31 . . . 409-36 can be implemented in a number of different ways to provide a switching mechanism. These switches can be implemented in a number of ways convenient for integrated circuit construction, for example, but not limited to, transistors arranged to be selectable between an on-mode or an off-mode. Though not shown, control signals to these switches can be provided by signal processing circuit 420 or other control unit. Switches 409-21 . . . 409-26, and 409-31 . . . 409-36 of the switched capacitor circuit can be operated at about 1 MHz or other relatively high rate, while the AC excitation can be in the range of 1 Hz to 10 kHz or other range.

Charge integrator 410 is an integrator circuit to integrate charge difference from sampling capacitors of the switched capacitor circuit connected with opposite polarity to the integrator circuit. An input of charge integrator 410 is coupled to one end of a capacitor 407-44 and an output of charge integrator 410 is coupled to another end of capacitor 407-44. Another input of charge integrator 410 is coupled to one end of a capacitor 407-45 and another output of charge integrator 410 is coupled to another end of capacitor 407-45. These two outputs of charge integrator 410 are coupled to an ADC 435 at two different inputs of ADC 435. An output of ADC 435 is coupled to an input of signal processing circuit 420. This arrangement of charge integrator 410 and ADC 435 can provide a charge-balancing ADC circuit that can operate similar to charge-balancing ADC 210 of FIG. 2. Signal processing circuit 420 can be implemented similar to signal processing circuit 220 of FIG. 2 or similar to drive/demodulation circuit 320 of FIG. 3. ADC 435 can be coupled to provide a feedback to charge integrator 410 such that charge integrator 410 is operable to drive the feedback to regulate an average input to charge integrator 410 to be substantially zero.

A feedback loop is coupled to the output of ADC 435 and the input of signal processing circuit 420, where the coupling is at an input of a digital-to-analog converter (DAC) 445. Two output nodes of DAC 445 are coupled back to the two input nodes of charge integrator 410 to which capacitors 407-44 and 407-45 and the switched capacitor circuit, which provides ΔQ, are coupled as shown in FIG. 4. This feedback coupling is provided by another switched capacitor circuit that includes switches 409-51 . . . 409-56 and capacitors 407-46 and 407-47 to capture feedback charge QFB. The feedback loop can regulate feedback charge QFB to approximate the inverse of the difference of the battery cell charge. Charge integrator 410 can drive the feedback so as to regulate its average input to substantially zero. Switches 409-51 . . . 409-56 can be operated at about 1 MHz or other relatively high rate in conjunction with switches 409-21 . . . 409-26, and 409-31 . . . 409-36.

Signal processing circuit 420 can be configured to process input from ADC 435 to determine an electrical impedance of battery 404-2, in response to battery 404-2 excited with battery 404-3 non-excited. Signal processing circuit 420 can also process input from ADC 335 to determine an electrical impedance of battery 404-3, in response to battery 404-3 excited with battery 404-2 non-excited. Electrical impedance of a battery can be calculated using a ratio between a drive signal applied in the dual-cell measurement circuit 400 and a detected signal in the dual-cell measurement circuit 400 in response to the application of the drive signal. Signal processing circuit 420 can be structured to generate time varying signals at different frequencies with signal processing circuit 420 arranged to process input from ADC 435 to determine an electrical impedance of battery 404-2. Signal processing circuit 420 is operable to selectively excite battery 404-3 with a second time varying signal at different frequencies while maintaining battery 404-2 in a non-excitation status during the exciting of battery 404-3. Signal processing circuit 420 can have an output to transmit digital data that represents the frequency-dependent electrical impedance of battery 404-2 or battery 404-3 over a bus to a processor at which one or more of a state of charge, a state of health, and an internal temperature of battery 404-3 or battery 404-2, respectively, are determined using the frequency-dependent electrical impedance.

Dual-cell measurement circuit 400 including charge integrator 410, ADC 435, signal processing circuit 420, DAC 445, and other components can be disposed in an integrated circuit, with the integrated circuit attachable to battery 404-2 and battery 404-3. A device, which can include an integrated circuit containing a dual-cell measurement circuit, such as dual-cell measurement circuit 400, can include multiple integrated circuits attached to multiple pairs of battery cells of a stack of battery cells with each integrated circuit coupled to one pair of battery cells different from battery cells coupled to other integrated circuits of the multiple integrated circuits. Such battery cells in the stack can be coupled in electrical series such that, in operation, the load current is common to each battery cell of the stack. Each integrated circuit structured, with respect to the pair of battery cells to which the integrated circuit is attached, can include a charge integrator, an ADC, a number of switched capacitor circuits, a DAC, and a signal processing circuit to determine an electrical impedance of each of the battery cells of the pair. The signal processing circuit can be arranged to selectively excite one battery cell of the pair of battery cells with a time varying signal while maintaining the other battery cell of the pair of battery cells in a non-excitation status during the exciting of the one battery cell of the pair. The charge integrator can measure a charge difference with one battery cell of the pair excited and with the other battery cell of the pair in the non-excitation status. The signal processing circuit can determine an electrical impedance of the one battery cell from measuring voltage charge. Then, the signal processing circuit can reverse the application of a time varying signal by exciting battery cell of the pair of battery cells that was previously in a non-excitation status, while maintaining the previously excited battery of the pair in the non-excitation status. From the reversed application of a time varying signal, the electrical impedance of the other battery cell of the cell can be determined.

In the example of FIG. 4, the set 402 of battery cells can be coupled to three integrated circuits as discussed above. An integrated circuit can be attached to the pair of batteries 404-0 and 404-1 to monitor these batteries and determine the electrical impedance of battery 404-0 and battery 404-1. An integrated circuit, as noted above, can be attached to the pair of batteries 404-2 and 404-3 to monitor these batteries and determine the electrical impedance of battery 404-2 and battery 404-3. An integrated circuit can be attached to the pair of batteries 404-4 and 404-5 to monitor these batteries and determine the electrical impedance of battery 404-4 and battery 404-5. In arrangements in which set 402 has more than six batteries, such arrangements can include more than three independent integrated circuits, for example N/2 integrated circuits where N is the number of batteries in the set 302, where N is a positive even integer. A sharing arrangement can be used for the set 402 having an odd number of batteries.

Figure 5:
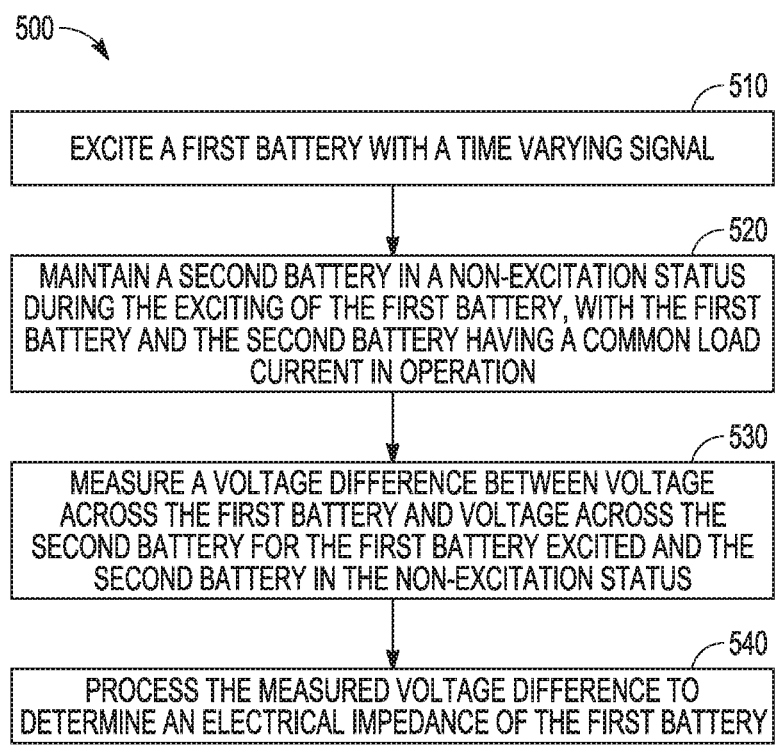
FIG. 5 is a flow diagram of features of an example method of determining a battery parameter, according to various embodiments.

FIG. 5 is a flow diagram of features of an embodiment of an example method 500 of determining a battery parameter. Method 500 can be applied to multiple batteries. At 510, a first battery is excited with a time varying signal. At 520, a second battery is maintained in a non-excitation status during the exciting of the first battery, with the first battery and the second battery having a common load current in operation. The common load current can be attained with the first battery and the second battery arranged in electrical series in which the common load current flows. The first battery and the second battery can be disposed in an arrangement of multiple batteries, where the arrangement has more than two batteries. The arrangement of multiple batteries can be a stack of batteries. The first battery and the second battery can be directly adjacent battery cells in a stack of battery cells with the battery cells arranged in series such that, in operation, the load current is common to each battery cell of the stack. The first battery and the second battery can be arranged as battery cells in a stack of batteries where other battery cells separate the first battery and the second battery, with the first battery and the second battery sharing the common load current.

At 520, a voltage difference between voltage across the first battery and voltage across the second battery is measured for the first battery excited and the second battery in the non-excitation status. At 530, the measured voltage difference is processed to determine an electrical impedance of the first battery.

Variations of method 500 or methods similar to the method 500 can include a number of different embodiments that may be combined depending on the application of such methods and/or the architecture of systems in which such methods are implemented. Such methods can include determining a frequency-dependent electrical impedance of each battery cell of a stack of battery cells, including the first battery and the second battery, with each battery cell arranged on a pair-wise basis with one other battery cell of the stack. The determination of the frequency-dependent electrical impedance of each battery cell can include selectively exciting the respective battery cell of a pair with the other battery cell of the pair maintained in the non-excitation status; and determining a voltage difference between voltage across the respective battery cell of the pair and voltage across the other battery cell of the pair maintained in a non-excitation status.

Variations of the method 500 or methods similar to the method 500 can include varying frequency of the time varying signal and determining frequency-dependent electrical impedance of the first battery using the time varying signal with varying frequencies. From processing the frequency-dependent electrical impedance of the first battery, one or more of a SOC, a SOH, and an internal temperature of the first battery can be determined. The determination of the one or more of a SOC, a SOH, and an internal temperature can be made by a processor that receives digital data, which represents the frequency-dependent electrical impedance, over a bus transmitted from a signal processing circuit that processed the measured voltage difference to determine an electrical impedance of the first battery.

Variations of the method 500 or methods similar to the method 500 can include measuring the voltage difference by sampling the first battery and the second battery with a switched capacitor circuit. Such variations can include integrating charge difference with sampling capacitors of the switched capacitor circuit connected with opposite polarity to a charge integrator circuit.

In various embodiments, a device, having a structure to measure a battery parameter, can comprise a signal driver attachable to two battery cells, a circuit to measure voltage difference between voltage across the first battery cell of the two battery cells and voltage across the second battery cell of the two battery cells, and a signal processing circuit to process the measured voltage difference to determine an electrical impedance of the first battery cell or the second battery cell. The signal driver can be arranged to selectively excite the first battery cell of the two battery cells with a time varying signal while maintaining the second battery cell of the two battery cells in a non-excitation status during the exciting of the first battery cell. The first battery cell and the second battery can be arranged with respect to each other such that the first battery cell and the second battery cell have a common load current in operation. The circuit to measure voltage difference between voltage across the first battery cell and voltage across the second battery cell is operable to measure the voltage with the first battery cell excited and with the second battery cell of the two battery cells in the non-excitation status. The difference measurement can be made with the first battery cell and the second battery having a common load current. The first battery cell and the second battery cell can be constructed in a number of arrangements. The first battery cell and the second battery cell can be arranged in series in a stack of battery cells. The first battery cell and the second battery cell can be directly adjacent cells in a stack of battery cells with the battery cells arranged in series such that, in operation, the load current is common to each battery cell of the stack.

Variations of such a device or similar devices can include a number of different embodiments that may be combined depending on the application of such devices or the architecture of systems in which such devices are implemented. The signal driver can be arranged to generate the time varying signal with different frequencies and the signal processing circuit can be arranged to process measured voltage differences at the different frequencies to determine a frequency-dependent electrical impedance of the first battery cell. The signal driver can be operable to selectively excite the second battery cell with a second time varying signal while maintaining the first battery cell in a non-excitation status during the exciting of the second battery cell, with the first battery cell and the second battery cell having a common load current in operation. The signal processing circuit can be arranged to transmit digital data that represents the frequency-dependent electrical impedance over a bus to a processor at which one or more of a SOC, a SOH, and an internal temperature of the first battery cell are determined based on frequency-dependent electrical impedance.

Variations of such a device or similar devices can include a charge-balancing analog-to-digital converter coupling the signal processing circuit to the circuit to measure voltage difference. Other variations can include a switched capacitor circuit to sample the first battery cell and the second battery cell. Such a device or similar devices can include an integrator circuit to integrate charge difference from sampling capacitors of the switched capacitor circuit connected with opposite polarity to the integrator circuit. Such a device or similar devices can include an analog-to-digital converter coupled to an output of the integrator circuit with the analog-to-digital converter coupled to provide a feedback to the integrator circuit such that the integrator circuit is operable to drive the feedback to regulate an average input to the integrator circuit to be substantially zero.

Variations of such a device or similar devices can include the signal driver, the circuit to measure voltage difference, and the signal processing circuit being disposed in a first integrated circuit, with the first integrated circuit attachable to the first battery cell and to the second battery cell. Variations can include multiple integrated circuits attached to multiple pairs of battery cells of a stack of battery cells with each integrated circuit coupled to one pair of battery cells different from battery cells coupled to other integrated circuits of the multiple integrated circuits, the first integrated circuit being one of the multiple integrated circuits, with the battery cells in the stack coupled in series such that, in operation, the load current is common to each battery cell of the stack. Each integrated circuit can be structured, with respect to the pair of battery cells to which the integrated circuit is attached, having: a signal driver attachable to the pair of battery cells, the signal driver arranged to selectively excite one battery cell of the pair of battery cells with a time varying signal while maintaining the other battery cell of the pair of battery cells in a non-excitation status during the exciting of the one battery cell of the pair; a circuit to measure voltage difference between voltage across the one battery cell of the pair and voltage across the other battery cell of the pair, with the one battery cell of the pair excited and with the other battery cell of the pair in the non-excitation status; and a signal processing circuit to process the measured voltage difference to determine an electrical impedance of the one battery cell.

In various embodiments, a device, having a structure to measure a battery parameter, can comprise a means for exciting selectively a first battery of a pair of batteries with a time varying signal and for maintaining a second battery of the pair in a non-excitation status during the exciting of the first battery, with the first battery and the second battery having a common load current in operation; a means for measuring a voltage difference between voltage across the first battery and voltage across the second battery; and a means for processing the measured voltage difference to determine an electrical impedance of the first battery.

Variations of such a device or similar devices can include a number of different embodiments that may be combined depending on the application of such devices or the architecture of systems in which such devices are implemented. For example, the means for exciting selectively the first battery can include a means for varying frequency of the time varying signal. The means for processing the measured voltage difference can include a means for determining frequency-dependent electrical impedance of the first battery using the time varying signal with varying frequencies and a means for determining a state of charge, a state of health, and an internal temperature of the first battery from processing the frequency-dependent electrical impedance of the first battery. The means for determining a SOC, a SOH, and an internal temperature of the first battery from processing the frequency-dependent electrical impedance of the first battery can be remote from and coupled, by a bus, to the means for determining frequency-dependent electrical impedance of the first battery using the time varying signal with varying frequencies. Variations of such a device or similar devices can include a means for capacitively sampling the first battery voltage and the second battery voltage and a means for a integrating charge difference with sampling capacitors connected with opposite polarity to the means for integrating charge difference.

Figure 6:
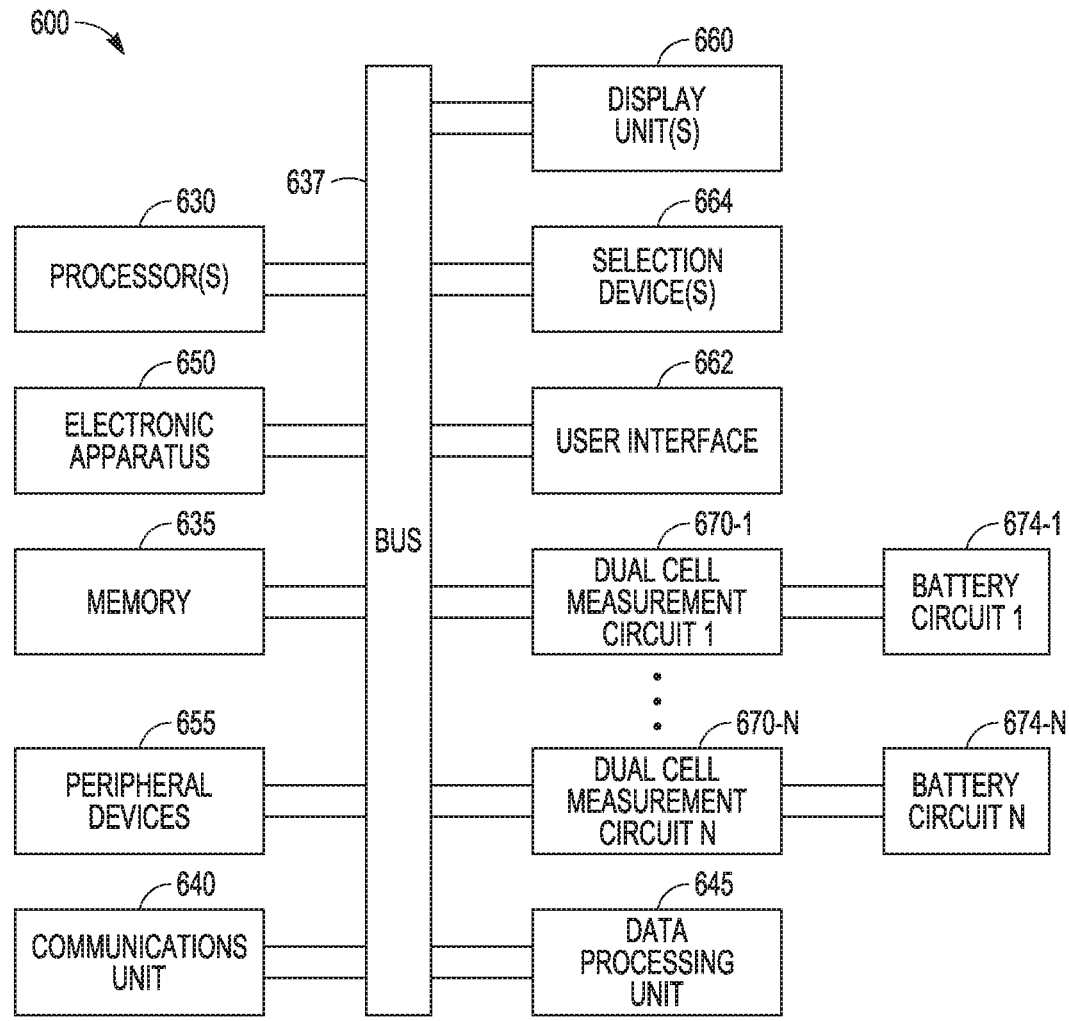
FIG. 6 is a flow diagram of features of an example method of determining a battery parameter, according to various embodiments.

FIG. 6 is a block diagram of features of an embodiment of an example system 600 having a set of batteries and a set of dual-cell measurement circuits 670-1 . . . 670-N. The set of batteries are arranged in pairs 674-1 . . . 674-N of batteries with each battery pair coupled to an individual dual-cell measurement circuit separate from the other dual-cell measurement circuits of the set of batteries. Dual-cell measurement circuit 670-1 is coupled to battery pair 674-1 and dual-cell measurement circuit 670-N is coupled to battery pair 674-N, with other dual-cell measurement circuits coupled to corresponding battery pairs. The batteries in a pair can be a nearest neighbor, such as adjacent battery cells in a stack of batteries. Alternatively, the batteries in a pair can be different than nearest neighbors, such as battery cells separated by one or more other battery cells in a stack of battery cells. Dual-cell measurement circuits 670-1 . . . 670-N can be implemented in N integrated circuits that are attached individually to corresponding battery pairs 674-1 . . . 674-N, respectively. The set of batteries and the set of dual-cell measurement circuits can be implemented in a number of apparatus that use batteries and use BMSs to keep track of SOC, SOH, temperature, or combinations thereof of the batteries. The batteries and the dual-cell measurement circuits can be implemented in battery cell stacks such as, but not limited to, large battery cell stacks used in electric vehicles.

System 600 can be a networked system in which the batteries and the dual-cell measurement circuits are disposed in an apparatus with dual-cell measurement circuits 670-1 . . . 670-N attached to respective battery pairs 674-1 . . . 674-N and coupled to a bus 637 to provide outputs from the dual-cell measurement circuits 670-1 . . . 670-N to determine SOC and SOH of the batteries remotely from the dual-cell measurement circuits 670-1 . . . 670-N. The dual-cell measurement circuits 670-1 . . . 670-N can be implemented similar to dual-cell measurement circuit 100A of FIG. 1A, dual-cell measurement circuit 200 of FIG. 2, dual-cell measurement circuit 300 of FIG. 3, dual-cell measurement circuit 400 of FIG. 4, similar dual-cell measurement circuits, or combinations thereof.

System 600 may also include a number of components such as one or more processors 630, memory 635, communications unit 640, data processing unit 645, electronic apparatus 650, peripheral devices 655, display unit(s) 660, user interface 662, and selection device(s) 664. The one or more processors 630 may operate as a single processor or a group of processors. Processors of the group of processors may operate independently depending on an assigned function. One or more processors 630 can be realized in one or more application-specific integrated circuits (ASICs). One or more processors 630 may be realized in one or more digital signal processors (DSPs). In controlling operation of the components of system 600 to execute schemes associated the functions for which system 600 is designed, one or more processors 630 can direct access of data to and from a database.

System 600 can include one or more processors 630, memory 635, and communications unit 640 arranged to operate as a processing unit to control management of the set of batteries and a set of dual-cell measurement circuits 670-1 . . . 670-N. Such control management can include the scheduling of operating dual-cell measurement circuits 670-1 . . . 670-N to monitor the set of batteries to measure frequency-dependent electrical impedance of each of the batteries of the set of batteries to determine one or more or SOC, SOH, and internal temperature of each battery. In addition, for example, the one or more processors 630, memory 635, and communications unit 640 can be arranged to adjust operating parameters of the set of batteries. Management of the set of batteries can include a master algorithm to balance all cells against each other. Depending on the application, communications unit 640 may use combinations of wired communication technologies and wireless technologies.

Memory 635 can include a database having information, algorithms, and other data such that system 600 can operate on data from dual-cell measurement circuits 670-1 . . . 670-N. Algorithms stored in memory 635 can algorithms for computations and modeling be used to extract SOC, SOH, and temperature of the batteries in the battery pairs 674-1 . . . 674-N from frequency-dependent electrical impedances measured by the dual-cell measurement circuits 670-1 . . . 670-N. Theses computation and modeling algorithms can include a number of different known algorithms. Such impedance measured from a dual-cell measurement circuit can be calculated using a ratio between a drive signal applied in the dual-cell measurement circuit and a detected signal in the dual-cell measurement circuit in response to the application of the drive signal. Data processing unit 645 can be implemented as a standalone unit to determine SOC, SOH, and temperature of the batteries from frequency-dependent electrical impedances or data processing unit 645 may be distributed among the components of system 600 including memory 635 and/or electronic apparatus 650.

Bus 637 provides electrical conductivity among the components of system 600. Bus 637 may include an address bus, a data bus, and a control bus, where each may be independently configured. Bus 637 may be realized using a number of different communication mediums that allows for the distribution of components of system 600. Use of bus 637 can be regulated by one or more processors 630. Bus 637 may be operable as part of a communications network to transmit and receive signals including data signals and command and control signals.

In various embodiments, peripheral devices 655 may include drivers to provide voltage and/or current input to dual-cell measurement circuits 670-1 . . . 670-N, additional storage memory and/or other control devices that may operate in conjunction with the one or more processors 630 and/or memory 635. Display unit(s) 660 can be arranged with a screen display that can be used with instructions stored in memory 635 to implement user interface 662 to manage the operation of dual-cell measurement circuits 670-1 . . . 670-N and/or components distributed within system 600. Such a user interface can be operated in conjunction with communications unit 640 and bus 637. Display unit(s) 660 can include a video screen or other structure to visually project data/information and images. System 600 can include a number of selection devices 664 operable with user interface 662 to provide user inputs to operate data processing unit 645 or its equivalent. Selection device(s) 664 can include a touch screen or a selecting device operable with user interface 662 to provide user inputs to operate data processing unit 645 or other components of system 600.

The following are example embodiments of devices and methods of operation, in accordance with the teachings herein.

An example device 1, having a structure to measure a battery parameter, can comprise: a signal driver attachable to two battery cells, the signal driver arranged to selectively excite a first battery cell of the two battery cells with a time varying signal while maintaining a second battery cell of the two battery cells in a non-excitation status during the exciting of the first battery cell, with the first battery cell and the second battery cell having a common load current in operation; a circuit to measure voltage difference between voltage across the first battery cell and voltage across the second battery cell, with the first battery cell excited and with the second battery cell of the two battery cells in the non-excitation status; and a signal processing circuit to process the measured voltage difference to determine an electrical impedance of the first battery cell.

An example device 2, having a structure to measure a battery parameter, can include features of example device 1 and can include the first battery cell and the second battery cell being directly adjacent cells in a stack of battery cells with the battery cells arranged in series such that, in operation, the load current is common to each battery cell of the stack.

An example device 3, having a structure to measure a battery parameter, can include features of any of the preceding example devices and can include the signal driver being arranged to generate the time varying signal with different frequencies and the signal processing circuit is arranged to process measured voltage differences at the different frequencies to determine a frequency-dependent electrical impedance of the first battery cell.

An example device 4, having a structure to measure a battery parameter, can include features of example device 3 or features of any of the preceding example devices and can include the signal processing circuit being arranged to transmit digital data that represents the frequency-dependent electrical impedance over a bus to a processor at which one or more of a state of charge, a state of health, and an internal temperature of the first battery cell are determined based on the frequency-dependent electrical impedance.

An example device 5, having a structure to measure a battery parameter, can include features of example device 3 or features of any of the preceding example devices and can include the signal driver being operable to selectively excite the second battery cell with a second time varying signal while maintaining the first battery cell in a non-excitation status during the exciting of the second battery cell, with the first battery cell and the second battery cell having a common load current in operation, to determine a frequency-dependent electrical impedance of the second battery cell.

An example device 6, having a structure to measure a battery parameter, can include features of any of the preceding example devices and can include a switched capacitor circuit to sample the first battery cell and the second battery cell.

An example device 7, having a structure to measure a battery parameter, can include features of example device 6 or features of any of the preceding example devices and can include an integrator circuit to integrate charge difference from sampling capacitors of the switched capacitor circuit connected with opposite polarity to the integrator circuit.

An example device 8, having a structure to measure a battery parameter, can include features of example device 7 or features of any of the preceding example devices and can include an analog-to-digital converter coupled to an output of the integrator circuit with the analog-to-digital converter coupled to provide a feedback to the integrator circuit such that the integrator circuit is operable to drive the feedback to regulate an average input to the integrator circuit to be substantially zero.

An example device 9, having a structure to measure a battery parameter, can include features of any of the preceding example devices and can include a charge-balancing analog-to-digital converter coupling the signal processing circuit to the circuit to measure voltage difference.

An example device 10, having a structure to measure a battery parameter, can include features of any of the preceding example devices and can include the signal driver, the circuit to measure voltage difference, and the signal processing circuit are disposed in a first integrated circuit, with the first integrated circuit attachable to the first battery cell and to the second battery cell.

An example device 11, having a structure to measure a battery parameter, can include features of example device 10 or features of any of the preceding example devices and can include multiple integrated circuits attached to multiple pairs of battery cells of a stack of battery cells with each integrated circuit coupled to one pair of battery cells different from battery cells coupled to other integrated circuits of the multiple integrated circuits, the first integrated circuit being one of the multiple integrated circuits, with the battery cells in the stack coupled in series such that, in operation, the load current is common to each battery cell of the stack, and with each integrated circuit structured, with respect to the pair of battery cells to which the integrated circuit is attached, having: a signal driver attachable to the pair of battery cells, the signal driver arranged to selectively excite one battery cell of the pair of battery cells with a time varying signal while maintaining the other battery cell of the pair of battery cells in a non-excitation status during the exciting of the one battery cell of the pair; a circuit to measure voltage difference between voltage across the one battery cell of the pair and voltage across the other battery cell of the pair, with the one battery cell of the pair excited and with the other battery cell of the pair in the non-excitation status; and a signal processing circuit to process the measured voltage difference to determine an electrical impedance of the one battery cell.

An example device 12, having a sampling structure, can comprise: a means for exciting selectively a first battery of a pair of batteries with a time varying signal and for maintaining a second battery of the pair in a non-excitation status during the exciting of the first battery, with the first battery and the second battery having a common load current in operation; a means for measuring a voltage difference between voltage across the first battery and voltage across the second battery; and a means for processing the measured voltage difference to determine an electrical impedance of the first battery.

An example device 13, having a structure to measure a battery parameter, can include features of example device 12 and can include the means for exciting selectively the first battery to include a means for varying frequency of the time varying signal; and the means for processing the measured voltage difference to include a means for determining frequency-dependent electrical impedance of the first battery using the time varying signal with varying frequencies and a means for determining a state of charge, a state of health, and an internal temperature of the first battery from processing the frequency-dependent electrical impedance of the first battery.

An example device 14, having a structure to measure a battery parameter, can include features of example devices 12 and 13 and can include a means for capacitively sampling the first battery voltage and the second battery voltage and a means for integrating a charge difference with sampling capacitors connected with opposite polarity to the means for integrating charge difference.

An example method 1 of determining a battery parameter can comprise: exciting a first battery with a time varying signal; maintaining a second battery in a non-excitation status during the exciting of the first battery, with the first battery and the second battery having a common load current in operation; measuring a voltage difference between voltage across the first battery and voltage across the second battery for the first battery excited and the second battery in the non-excitation status; and processing the measured voltage difference to determine an electrical impedance of the first battery.

An example method 2 of determining a battery parameter can include features of example method 1 and can include the first battery and the second battery being directly adjacent battery cells in a stack of battery cells with the battery cells arranged in series such that, in operation, the load current is common to each battery cell of the stack.

An example method 3 of determining a battery parameter can include features of any of the preceding example methods and can include a determining frequency-dependent electrical impedance of each battery cell of a stack of battery cells, including the first battery and the second battery, with each battery cell arranged on a pair-wise basis with one other battery cell of the stack, by, for each battery cell: selectively exciting the respective battery cell of a pair with the other battery cell of the pair maintained in the non-excitation status; and determining a voltage difference between voltage across the respective battery cell of the pair and voltage across the other battery cell of the pair maintained in a non-excitation status.

An example method 4 of determining a battery parameter can include features of any of the preceding example methods and can include varying a frequency of the time varying signal; determining frequency-dependent electrical impedance of the first battery using the time varying signal with varying frequencies; and determining a state of charge, a state of health, and an internal temperature of the first battery from processing the frequency-dependent electrical impedance of the first battery.

An example method 5 of determining a battery parameter can include features of any of the preceding example methods and can include measuring the voltage difference to include sampling the first battery and the second battery with a switched capacitor circuit.

An example method 6 of determining a battery parameter can include features of example method 5 or features of any of the preceding example methods and can include integrating charge difference with sampling capacitors of the switched capacitor circuit connected with opposite polarity to a charge integrator circuit.

An example method 7 of determining a battery parameter can include features of any of the preceding example methods of determining a battery parameter and can include performing functions associated with any features of example devices 1-14 having a structure to measure a battery parameter and any features of example devices associated with the figures herein.

In various embodiments, a dual-cell measurement approach can be applied to a set of batteries on a pair-wise basis. In this approach, one battery of a pair undergoes AC excitation while the other battery of the pair is non-AC excited, with both batteries of the pair under a common DC load current. A differential measurement with respect to the two batteries of the pair can be made to measure AC electrical impedance of the battery cell exited. This impedance measurement can be used to determine one or more of the SOC, SOH, and temperature of the excited battery of the pair. Excitation and non-excitation of the two batteries of the battery pair can be reversed to determine one or more of the SOC, SOH, and temperature of this other battery from measurement of the AC electrical impedance of this other battery cell of the pair. The dual-cell measurement approach can be extended to multiple-cell measurement approach with selection of a battery to be subjected to AC excitation, while the other batteries are not AC excited, with all the batteries involved under a common DC load current. Differential measurement of the AC electrical impedance of the excited battery cell of the multiple batteries can be made, from which measurement one or more of the SOC, SOH, and temperature of the excited battery can be determined. The other batteries of the multiple batteries can be measured in the same manner, one at a time.

Differential measurement in a multi-cell approach can provide enhancements associated with determination of AC electrical impedance and one or more of the SOC, SOH, and temperature of a cell. In a dual-cell approach, one IC can be used per two cells of a set of battery cells. This can provide a cost reduction of two times as compared to systems that use one measurement IC per one battery. This can provide a better proposition for automotive users. In addition, cancellation of load current effects can be made right at the source such that processing of the load current signal can be avoided. Individual battery cell voltage measurements can be removed. Since a BMS IC can be implemented to balance battery cells, applying the dual-cell approach with differential measurement to two neighboring cells of a set of battery cells, where neighboring cells are likely to have the same voltage, making cancellation elements of the approach work well. It is convenient to use neighboring battery cells, but the dual-cell approach can be implemented with two non-neighboring battery cells of the same stack. All battery cells in the same stack are likely to be at the same voltage, because there is typically a balancing algorithm running in the background that has the task of keeping the cells at the same relative level of charge. Since the dual-cell approach with differential measurements can be implemented without a high pass filter this approach can save on the number of components used. In addition, such a dual-cell approach or similar approaches can be implemented without explicitly measuring current. Specific implementations, for example, switched-capacitor structures, fast sampling structures with near-instantaneous cancellation, and other implements, can be made with almost no overhead, and easier analog-to-digital conversion with smaller signal swing. In other embodiments, differential drive of the two cells in the dual-cell approach may lead to improved EIS methods.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A device having a structure to measure a battery parameter, the device comprising:
    a signal driver attachable to two battery cells, the signal driver arranged to selectively excite a first battery cell of the two battery cells with a time varying signal while maintaining a second battery cell of the two battery cells in a non-excitation status during the exciting of the first battery cell, with the first battery cell and the second battery cell having a common load current in operation, and selectively excite the second battery cell with a second time varying signal while maintaining the first battery cell in a non-excitation status during the exciting of the second battery cell, with the first battery cell and the second battery cell having a common load current in operation, to determine a frequency-dependent electrical impedance of the second battery cell;
    a circuit to measure voltage difference between voltage across the first battery cell and voltage across the second battery cell, with the first battery cell excited and with the second battery cell of the two battery cells in the non-excitation status; and
    a signal processing circuit to process the measured voltage difference to determine an electrical impedance of the first battery cell.

2. The device of claim 1, wherein the first battery cell and the second battery cell are directly adjacent cells in a stack of battery cells with the battery cells arranged in series such that, in operation, the load current is common to each battery cell of the stack.

3. The device of claim 1, wherein the signal driver is arranged to generate the time varying signal with different frequencies and the signal processing circuit is arranged to process measured voltage differences at the different frequencies to determine a frequency-dependent electrical impedance of the first battery cell and the second battery cell.

4. The device of claim 3, wherein the signal processing circuit is arranged to transmit digital data that represents the frequency-dependent electrical impedance over a bus to a processor at which one or more of a state of charge, a state of health, and an internal temperature of the first battery cell are determined based on the frequency-dependent electrical impedance.

5. The device of claim 1, wherein the device includes a switched capacitor circuit to sample the first battery cell and the second battery cell.

6. The device of claim 5, wherein the device includes an integrator circuit to integrate charge difference from sampling capacitors of the switched capacitor circuit connected with opposite polarity to the integrator circuit.

7. The device of claim 6, wherein the device includes an analog-to-digital converter coupled to an output of the integrator circuit with the analog-to-digital converter coupled to provide a feedback to the integrator circuit such that the integrator circuit is operable to drive the feedback to regulate an average input to the integrator circuit to be substantially zero.

8. The device of claim 1, wherein the device includes a charge-balancing analog-to-digital converter coupling the signal processing circuit to the circuit to measure voltage difference.

9. The device of claim 1, wherein the signal driver, the circuit to measure voltage difference, and the signal processing circuit are disposed in a first integrated circuit, with the first integrated circuit attachable to the first battery cell and to the second battery cell.

10. The device of claim 9, wherein the device includes multiple integrated circuits attached to multiple pairs of battery cells of a stack of battery cells with each integrated circuit coupled to one pair of battery cells different from battery cells coupled to other integrated circuits of the multiple integrated circuits, the first integrated circuit being one of the multiple integrated circuits, with the battery cells in the stack coupled in series such that, in operation, the load current is common to each battery cell of the stack, and with each integrated circuit structured, with respect to the pair of battery cells to which the integrated circuit is attached, having:
    a signal driver attachable to the pair of battery cells, the signal driver arranged to selectively excite one battery cell of the pair of battery cells with a time varying signal while maintaining the other battery cell of the pair of battery cells in a non-excitation status during the exciting of the one battery cell of the pair;

a circuit to measure voltage difference between voltage across the one battery cell of the pair and voltage across the other battery cell of the pair, with the one battery cell of the pair excited and with the other battery cell of the pair in the non-excitation status; and a signal processing circuit to process the measured voltage difference to determine an electrical impedance of the one battery cell.

11. A method of determining a battery parameter, the method comprising:

determining a frequency-dependent electrical impedance of each battery cell of a stack of battery cells with each battery cell arranged on a pair-wise basis with one other battery cell of the stack including a first battery cell and a second battery cell, and for each battery cell:

selectively exciting the respective battery cell of a pair using a time varying signal with the other battery cell of the pair maintained in the non-excitation status and the battery cells of the pair having a common load current in operation;

determining a voltage difference between voltage across the respective battery cell of the pair and voltage across the other battery cell of the pair maintained in a non-excitation status; and processing the measured voltage difference to determine an electrical impedance of the respective battery cell battery.

12. The method of claim 11, wherein the first battery cell and the second battery cell are directly adjacent battery cells in a stack of battery cells with the battery cells arranged in series such that, in operation, the load current is common to each battery cell of the stack.

13. The method of claim 11, wherein the method includes:

varying a frequency of the time varying signal;

determining frequency-dependent electrical impedance of the respective battery cell using the time varying signal with varying frequencies; and determining a state of charge, a state of health, and an internal temperature of the respective battery cell from processing the frequency-dependent electrical impedance of the respective battery cell.

14. The method of claim 11, wherein measuring the voltage difference includes sampling the first battery cell and the second battery cell with a switched capacitor circuit.

15. The method of claim 14, wherein the method includes integrating charge difference with sampling capacitors of the switched capacitor circuit connected with opposite polarity to a charge integrator circuit.

16. A device having a structure to measure a battery parameter, the device comprising:

a means for exciting selectively a first battery of a pair of batteries with a time varying signal and for maintaining a second battery of the pair in a non-excitation status during the exciting of the first battery, with the first battery and the second battery having a common load current in operation;

a means for measuring a voltage difference between voltage across the first battery and voltage across the second battery;

a means for processing the measured voltage difference to determine an electrical impedance of the first battery; and a means for capacitively sampling the first battery voltage and the second battery voltage and a means for integrating a charge difference with sampling capacitors connected with opposite polarity to the means for integrating charge difference.

17. The device of claim 16, wherein the means for exciting selectively the first battery includes a means for varying a frequency of the time varying signal; and the means for processing the measured voltage difference includes a means for determining a frequency-dependent electrical impedance of the first battery using the time varying signal with varying frequencies and a means for determining a state of charge, a state of health, and an internal temperature of the first battery from processing the frequency-dependent electrical impedance of the first battery.

* * * * *